US012772660B2

(12) United States Patent
Zhang et al.

(10) Patent No.: US 12,772,660 B2
(45) Date of Patent: Oct. 20, 2026

(54) DISPLAY PANEL AND DISPLAY APPARATUS

(71) Applicants: Wuhan Tianma Microelectronics Co., Ltd., Wuhan (CN); Wuhan Tianma Microelectronics Co., Ltd. Shanghai Branch, Pudong New District (CN)

(72) Inventors: Mengmeng Zhang, Wuhan (CN); Xingyao Zhou, Wuhan (CN); Jian Kuang, Wuhan (CN)

(73) Assignees: Wuhan Tianma Microelectronics Co, Ltd., Wuhan (CN); Wuhan Tianma Microelectronics Co., Ltd. Shanghai Branch, Pudong New District (CN)

( * ) Notice: Subject to any disclaimer, the term of this patent is extended or adjusted under 35 U.S.C. 154(b) by 0 days.

(21) Appl. No.: 19/176,205

(22) Filed: Apr. 11, 2025

(65) Prior Publication Data

US 2025/0241133 A1 Jul. 24, 2025

(30) Foreign Application Priority Data

Apr. 28, 2024 (CN) ........................ 202410525411.6

(51) Int. Cl.
*G09G 3/32* (2016.01)
*G09G 3/3233* (2016.01)
(Continued)

(52) U.S. Cl.
CPC ....... *H10K 59/1213* (2023.02); *G09G 3/3233* (2013.01); *H10K 59/131* (2023.02);
(Continued)

(58) Field of Classification Search
CPC ............. H10K 59/1213; H10K 59/131; G09G 3/3233; G09G 3/32; G09G 2300/0426;
(Continued)

(56) References Cited

U.S. PATENT DOCUMENTS 12,328,996 B2 * 6/2025 Diao .................... G09G 3/3225
2022/0319408 A1 * 10/2022 Wang ................... G09G 3/3225
(Continued)

FOREIGN PATENT DOCUMENTS

CN 108878494 B 12/2020
CN 108597374 B 2/2021
WO WO-2022174420 A1 * 8/2022 ......... H10K 59/1201

*Primary Examiner* — Jose R Soto Lopez
(74) *Attorney, Agent, or Firm* — Wiersch Law Group

(57) ABSTRACT

A display panel includes pixel sub-regions. Drive transistor of pixel drive circuit includes first electrode electrically connected to first electrode of transmission transistor and second electrode electrically connected to first electrode of light-emitting control transistor. A second electrode of light-emitting control transistor is electrically connected to first electrode of light-emitting element. An adjustment control signal line extends in a first direction and is connected to gate of the transmission transistor. A light-emitting control scanning signal line extends in the first direction and is connected to gate of the light-emitting control transistor. In a same pixel sub-region, in a second direction intersecting the first direction, orthographic projection of the light-emitting control scanning signal line on the substrate is located at a side of orthographic projection of a channel of the transmission transistor on the substrate away from orthographic projection of a channel of the drive transistor on the substrate.

18 Claims, 14 Drawing Sheets

(51) Int. Cl.
*H10K 59/121* (2023.01)
*H10K 59/131* (2023.01)

(52) U.S. Cl.
CPC ....... *G09G 3/32* (2013.01); *G09G 2300/0426* (2013.01); *G09G 2300/0842* (2013.01); *G09G 2300/0861* (2013.01); *G09G 2320/0238* (2013.01)

(58) Field of Classification Search
CPC ... G09G 2300/0842; G09G 2300/0861; G09G 2320/0238; H10D 86/60; H10D 86/441; H10H 20/857; H10W 90/00
See application file for complete search history.

(56) References Cited

U.S. PATENT DOCUMENTS

2023/0215350 A1* 7/2023 Shi ........................ G09G 3/2003
345/214
2023/0337465 A1* 10/2023 Huang ................. G09G 3/3233

* cited by examiner

DISPLAY PANEL AND DISPLAY APPARATUS

CROSS-REFERENCE TO RELATED APPLICATIONS

The present application claims priority to Chinese Patent Application No. 202410525411.6, filed on Apr. 28, 2024, the content of which is incorporated herein by reference in its entirety.

TECHNICAL FIELD

The present disclosure relates to the field of display technologies, and in particular, to a display panel and a display apparatus.

BACKGROUND

With increasing requirements for display technologies, display requirements for display panels become high.

However, if a pixel drive circuit in a display panel has improper wiring, once the pixel drive circuit operates in a low-frequency mode to drive a light-emitting element to perform black-state display, it is highly likely that the display panel is not black in a black state, thereby deteriorating display quality of the display panel.

SUMMARY

In a first aspect, embodiments of the present disclosure provide a display panel. The display panel includes pixel sub-regions; a substrate; a light-emitting element; a pixel drive circuit located at a side of the substrate and at least partially located in each of the pixel sub-regions; an adjustment control signal line extending in a first direction and connected to a gate of the transmission transistor; and a light-emitting control scanning signal line extending in the first direction and connected to a gate of the light-emitting control transistor. The light-emitting element includes a first electrode, a light-emitting layer and a second electrode. The pixel drive circuit includes a drive transistor, a light-emitting control transistor, and a transmission transistor. The drive transistor includes a first electrode electrically connected to a first electrode of the transmission transistor and a second electrode electrically connected to a first electrode of the light-emitting control transistor. A second electrode of the light-emitting control transistor is electrically connected to the first electrode of the light-emitting element. In a same pixel sub-region of the pixel sub-regions, in a second direction, an orthographic projection of the light-emitting control scanning signal line on the substrate is located at a side of an orthographic projection of a channel of the transmission transistor on the substrate away from an orthographic projection of a channel of the drive transistor on the substrate; and the first direction intersects the second direction.

In a second aspect, embodiments of the present disclosure provide a display apparatus. The display apparatus includes a display panel. The display panel includes pixel sub-regions; a substrate; a light-emitting element; a pixel drive circuit located at a side of the substrate and at least partially located in each of the pixel sub-regions; an adjustment control signal line extending in a first direction and connected to a gate of the transmission transistor; and a light-emitting control scanning signal line extending in the first direction and connected to a gate of the light-emitting control transistor. The light-emitting element includes a first electrode, a light-emitting layer and a second electrode. The pixel drive circuit includes a drive transistor, a light-emitting control transistor, and a transmission transistor. The drive transistor includes a first electrode electrically connected to a first electrode of the transmission transistor and a second electrode electrically connected to a first electrode of the light-emitting control transistor. A second electrode of the light-emitting control transistor is electrically connected to the first electrode of the light-emitting element. In a same pixel sub-region of the pixel sub-regions, in a second direction, an orthographic projection of the light-emitting control scanning signal line on the substrate is located at a side of an orthographic projection of a channel of the transmission transistor on the substrate away from an orthographic projection of a channel of the drive transistor on the substrate; and the first direction intersects the second direction.

BRIEF DESCRIPTION OF DRAWINGS

In order to more clearly illustrate technical solutions of embodiments of the present disclosure, the accompanying drawings used in the embodiments are briefly described below. Although the accompanying drawings in the following description show some specific embodiments of the present disclosure, those skilled in the art may extend to other structures and accompanying drawings based on basic concepts of a device structure, a driving method, and a manufacturing method disclosed and suggested in various embodiments of the present disclosure. It can be understood that these shall fall within the scope of the claims of the present disclosure.

DESCRIPTION OF EMBODIMENTS

In order to more clearly illustrate objectives, technical solutions, and advantages of the embodiments of the present disclosure, the technical solutions in the embodiments of the present disclosure are clearly and completely described in details with reference to the accompanying drawings. The described embodiments are merely part of the embodiments of the present disclosure rather than all of the embodiments. All other embodiments obtained by those skilled in the art based on the embodiments of the present disclosure without paying creative labor shall fall into the protection scope of the present disclosure.

Figure 1:
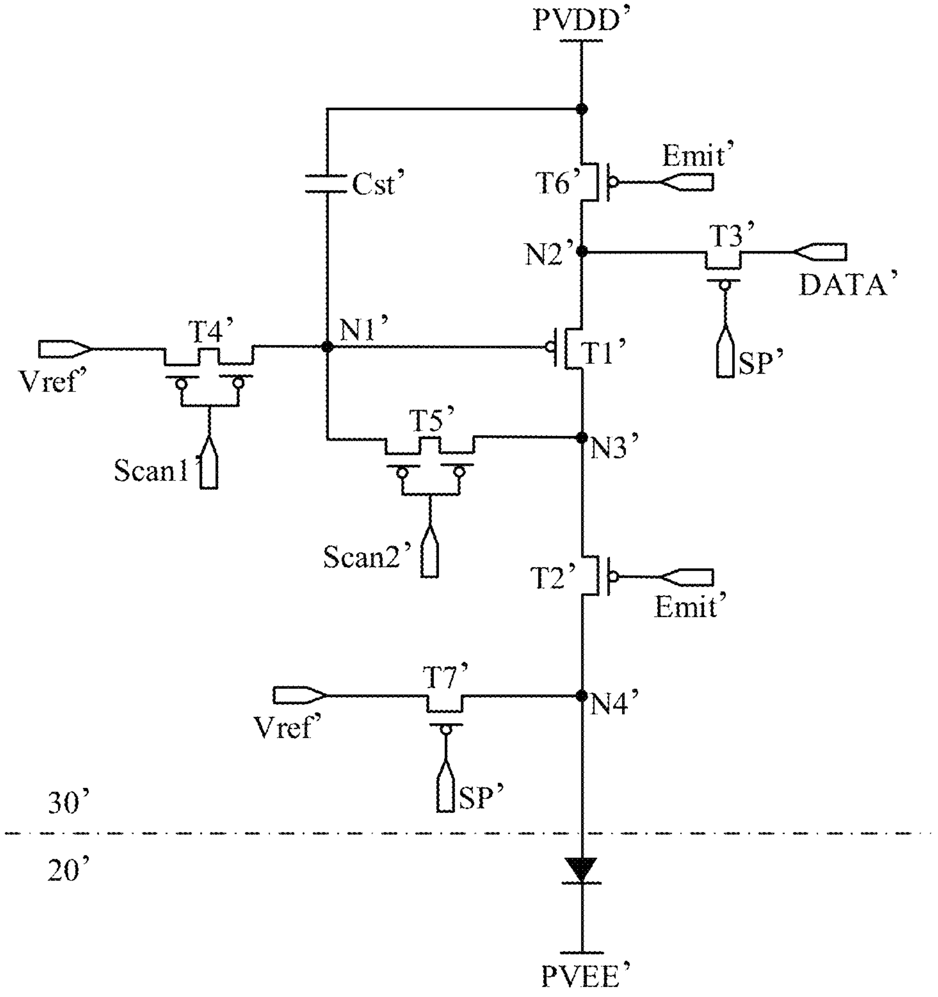
FIG. 1 (Prior art)
FIG. 1 is a structural schematic diagram of elements of a pixel drive circuit in the related art.
Figure 2:
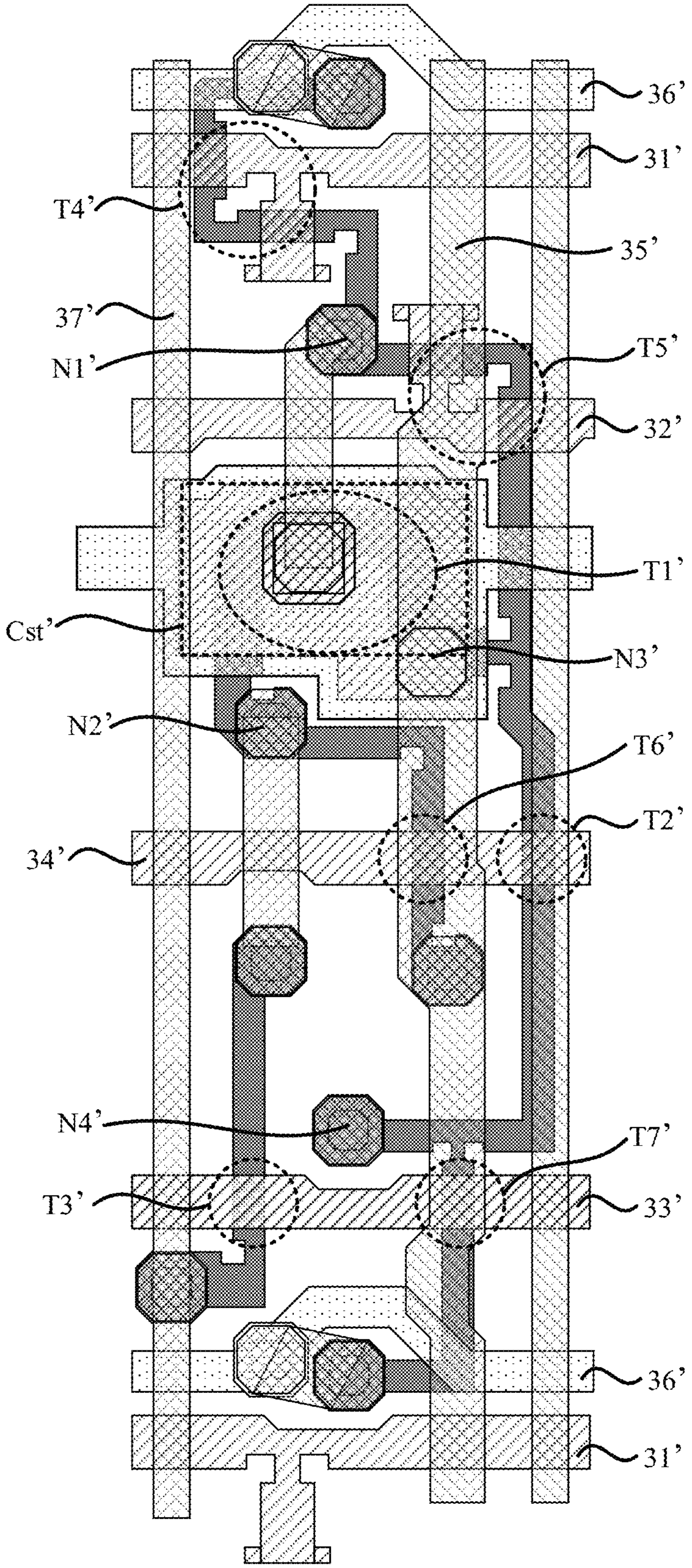
FIG. 2 (Prior art)
FIG. 2 is a structural schematic diagram of layers of the pixel drive circuit in the related art shown in FIG. 1.

FIG. 1 is a structural schematic diagram of elements of a pixel drive circuit in the related art. FIG. 2 is a structural schematic diagram of layers of the pixel drive circuit in the related art shown in FIG. 1. Referring to FIG. 1 and FIG. 2, for example, a pixel drive circuit 30' has a 7T1C structure, i.e., including 7 transistors (T1' to T7') and a storage capacitor Cst'. A display panel may include a first scanning line 31', a second scanning line 32', a third scanning line 33', a light-emitting control scanning signal line 34', a first power signal line 35', a reference voltage line 36', and a data signal line 37'. The pixel drive circuit 30' may include a drive transistor T1', a first light-emitting control transistor T2', a data writing transistor T3', a first reset transistor T4', a threshold compensation transistor T5', a second light-emitting control transistor T6', a light-emitting reset transistor T7', and the storage capacitor Cst'. A gate of the drive transistor T1', a first electrode of the threshold compensation transistor T5', and a first electrode of the first reset transistor T4' are electrically connected to a first node N1'. A first electrode of the drive transistor T1' and a first electrode of the data writing transistor T3' are electrically connected to a second node N2'. A second electrode of the drive transistor T1' and a first electrode of the first light-emitting control transistor T2' are electrically connected to a third node N3'. A second electrode of the first light-emitting control transistor T2' and an anode of a light-emitting element 20' are electrically connected to a fourth node N4'. A cathode of the light-emitting element 20' is electrically connected to a second power signal line (not shown in FIG. 2) for receiving a negative voltage signal PVEE'.

A first scanning signal Scan1' on the first scanning line 31' controls the first reset transistor T4' to be turned on or off. A second scanning signal Scan2' on the second scanning line 32' controls the threshold compensation transistor T5' to be turned on or off. A third scanning signal SP' on the third scanning line 33' controls the data writing transistor T3' and the light-emitting reset transistor T7' to be turned on or off. A light-emitting control scanning signal Emit' on the light-emitting control scanning signal line 34' controls the first light-emitting control transistor T2' and the second light-emitting control transistor T6' to be turned on or off. The first power signal line 35' provides a positive voltage signal PVDD'. The reference voltage line 36' provides a reference voltage signal Vref. The data signal line 37' provides a data signal DATA'.

Still referring to FIG. 1 and FIG. 2, because the third scanning signal SP' on the third scanning line 33' controls both the data writing transistor T3' and the light-emitting reset transistor T7' to be turned on or off, and the light-emitting control scanning signal line 34' is located between the data writing transistor T3' and the second node N2', the data writing transistor T3' and the second node N2' need to be connected through a crossover line, and the crossover line overlaps the light-emitting control scanning signal line 34'. However, when the light-emitting control scanning signal Emit' on the light-emitting control scanning signal line 34' jumps, the second node N2' is coupled, resulting in impact on a potential of the second node N2'. Especially when the light-emitting control scanning signal Emit' jumps from a low level to a high level, the potential of the second node N2' is coupled and pulled up, and electric leakage occurs in a direction toward the third node N3' and the fourth node N4', leading to an increase in a potential of the fourth node N4'. When the pixel drive circuit 30' operates in a low-frequency mode to drive the light-emitting element 20' to perform black-state display, a black-state voltage significantly increases. Consequently, the display panel is not black in a black state, thereby further deteriorating display quality of the entire display panel.

In view of the foregoing technical problem, the present disclosure provide a display panel. The display panel includes pixel sub-regions, a substrate, a light-emitting element, a pixel drive circuit, an adjustment control signal line, and a light-emitting control scanning signal line. The light-emitting element includes a first electrode, a light-emitting layer, and a second electrode. The pixel drive circuit is located at a side of the substrate and is at least partially located in the pixel sub-region. The pixel drive circuit includes a drive transistor, a light-emitting control transistor, and a transmission transistor. The drive transistor includes a first electrode electrically connected to a first electrode of the transmission transistor and a second electrode electrically connected to a first electrode of the light-emitting control transistor. A second electrode of the light-emitting control transistor is electrically connected to the first electrode of the light-emitting element. The adjustment control signal line extends in a first direction and is connected to a gate of the transmission transistor. The light-emitting control scanning signal line extends in the first direction and is connected to a gate of the light-emitting control transistor. In a same pixel sub-region, in a second direction, an orthographic projection of the light-emitting control scanning signal line on the substrate is located at a side of an orthographic projection of a channel of the transmission transistor on the substrate away from an orthographic projection of a channel of the drive transistor on the substrate. The first direction intersects the second direction.

The transmission transistor may be a data writing transistor configured to write a data signal into the first electrode of the drive transistor, or a bias adjustment transistor configured to perform bias adjustment on a potential of the first electrode of the drive transistor, which may be set based on an actual pixel drive circuit.

In the foregoing technical solution, the display panel includes pixel sub-regions. The pixel drive circuit is at least partially located in the pixel sub-region. The drive transistor in the pixel drive circuit includes the first electrode electrically connected to the first electrode of the transmission transistor and the second electrode electrically connected to the first electrode of the light-emitting control transistor. The second electrode of the light-emitting control transistor is electrically connected to the first electrode of the light-emitting element. The adjustment control signal line extends in the first direction and is connected to the gate of the transmission transistor so that an adjustment control signal on the adjustment control signal line can control the transmission transistor to be turned on or off. The light-emitting control scanning signal line extends in the first direction and is connected to the gate of the light-emitting control transistor so that a light-emitting control scanning signal on the light-emitting control scanning signal line can control the light-emitting control transistor to be turned on or off. In the same pixel sub-region, in the second direction, the orthographic projection of the light-emitting control scanning signal line on the substrate is located at the side of the orthographic projection of the channel of the transmission transistor on the substrate away from the orthographic projection of the channel of the drive transistor on the substrate. The first direction intersects the second direction. In this way, the light-emitting control scanning signal on the light-emitting control scanning signal line can be prevented from having coupling impact on the potential of the first electrode of the drive transistor. This resolves the problem in the related art that the display panel is not black in a black state when the pixel drive circuit operates in a low-frequency mode to drive the light-emitting element to perform black-state display, thereby improving display quality of the display panel.

The foregoing is a core idea of the present disclosure. The technical solutions in the embodiments of the present disclosure are described below clearly and completely with reference to the accompanying drawings in the embodiments of the present disclosure. The described embodiments are merely some rather than all of the embodiments of the present disclosure. All other embodiments obtained by those skilled in the art based on the embodiments of the present disclosure shall fall within the protection scope of the present disclosure.

Figure 3:
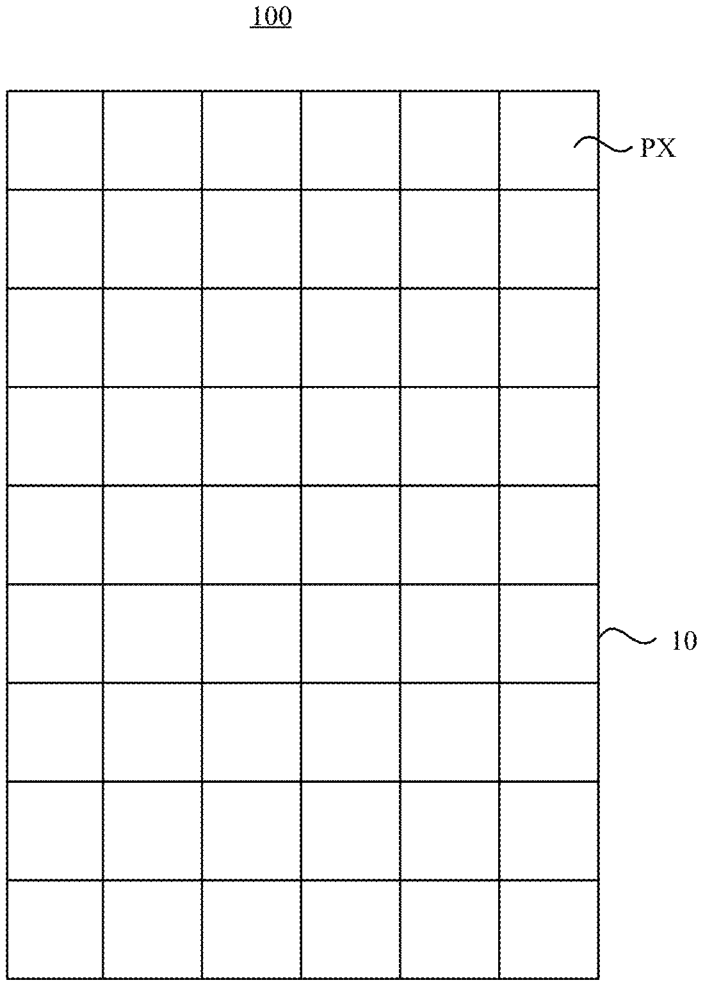
FIG. 3 is a structural schematic diagram of a display panel according to some embodiments of the present disclosure.
Figure 4:
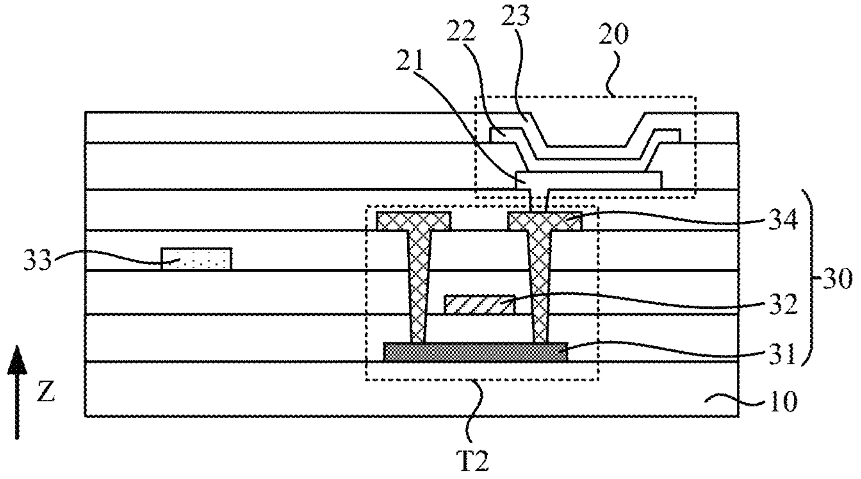
FIG. 4 is a sectional view of a display panel according to some embodiments of the present disclosure.
Figure 5:
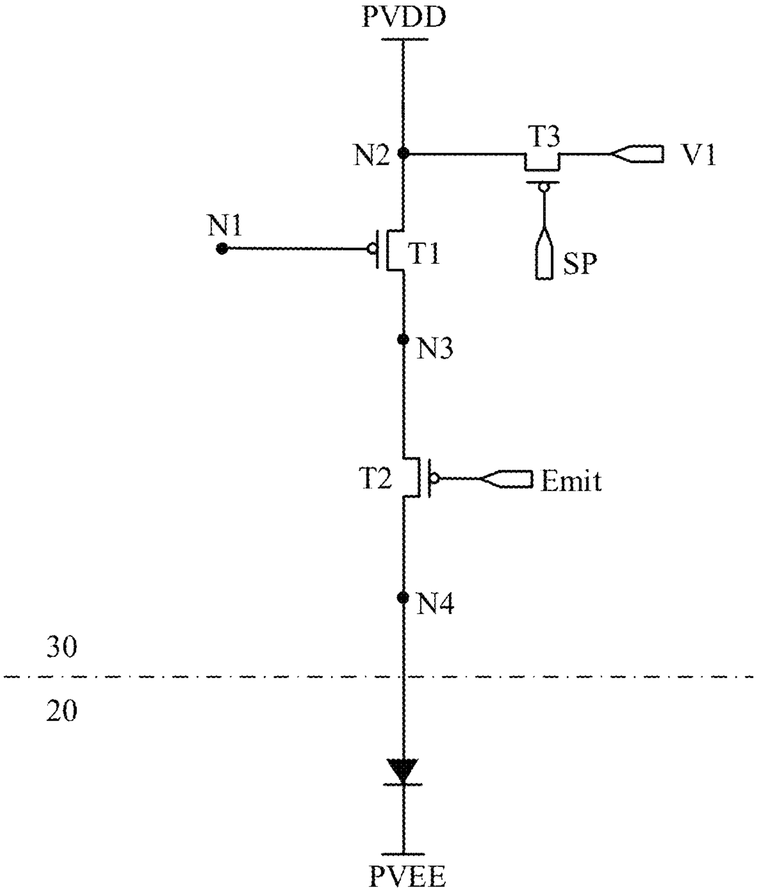
FIG. 5 is a structural schematic diagram of some elements of a pixel drive circuit according to some embodiments of the present disclosure.
Figure 6:
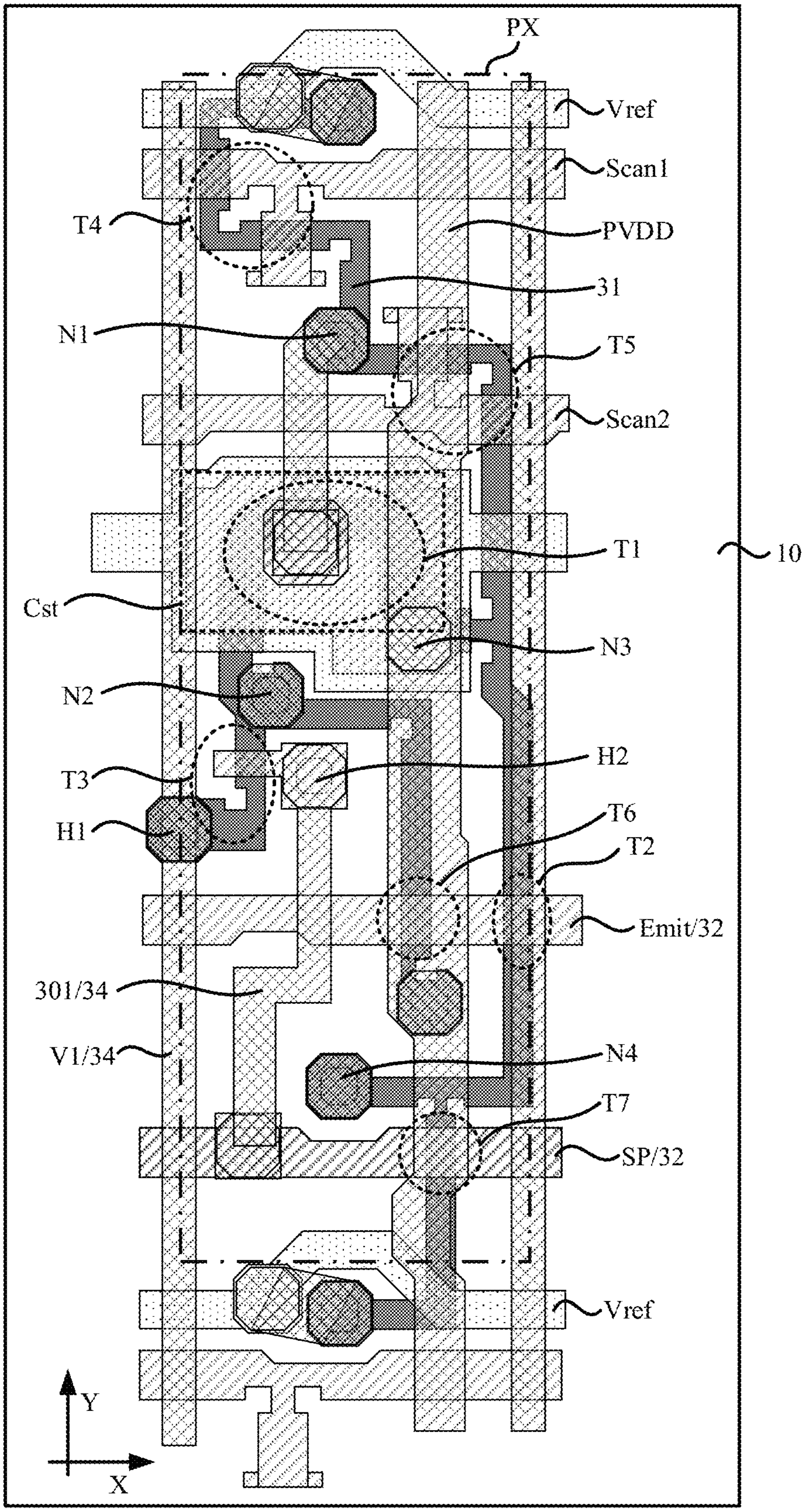
FIG. 6 is a structural schematic diagram of layers of a pixel drive circuit according to some embodiments of the present disclosure.

FIG. 3 is a structural schematic diagram of a display panel according to some embodiments of the present disclosure. FIG. 4 is a sectional view of a display panel according to some embodiments of the present disclosure. FIG. 5 is a structural schematic diagram of some elements of a pixel drive circuit according to some embodiments of the present disclosure. FIG. 6 is a structural schematic diagram of layers of a pixel drive circuit according to some embodiments of the present disclosure. Refer to FIG. 3 to FIG. 6, a display panel 100 includes a substrate 10. A light-emitting element 20 includes a first electrode 21, a light-emitting layer 22, and a second electrode 23. A pixel drive circuit 30 is located at a side of the substrate 10. The pixel drive circuit 30 is at least partially located in a pixel sub-region PX. The pixel drive circuit 30 includes a drive transistor T1, a light-emitting control transistor T2, and a transmission transistor T3. The drive transistor T1 includes a first electrode electrically connected to a first electrode of the transmission transistor T3 and a second electrode electrically connected to a first electrode of the light-emitting control transistor T2. A second electrode of the light-emitting control transistor T2 is electrically connected to the first electrode 21. An adjustment control signal line SP extends in a first direction X and is connected to a gate of the transmission transistor T3. A light-emitting control scanning signal line Emit extends in the first direction X and is connected to a gate of the light-emitting control transistor T2. In the same pixel sub-region PX, in a second direction Y, orthographic projection of the light-emitting control scanning signal line Emit on the substrate 10 is located at a side of orthographic projection of a channel of the transmission transistor T3 on the substrate 10 away from orthographic projection of a channel of the drive transistor T1 on the substrate 10. The first direction X intersects the second direction Y.

The substrate 10 may be a rigid substrate. For example, the substrate 10 is made of glass. Alternatively, the substrate 10 may be a flexible substrate. For example, a material of the substrate 10 may include one or more of following polymer resins: polyethersulfone, polyacrylate, polyetherimide, polyethylene naphthalate, polyethylene terephthalate, polyphenylene sulfide, polyarylate, polyimide, polycarbonate, and cellulose acetate propionate. The material of the substrate 10 is not limited herein.

Referring to FIG. 4, a layer where the pixel drive circuit 30 is located is an array layer located at a side of the substrate 10. The array layer may include a first semiconductor layer 31, a first metal layer 32, a second metal layer 33, and a third metal layer 34 that are stacked in sequence. FIG. 4 exemplarily shows a structure of the light-emitting control transistor T2 and a structure of the light-emitting element 20 in the pixel drive circuit 30. The first semiconductor layer 31 includes an active layer of the light-emitting control transistor T2. The first metal layer 32 may include the gate of the light-emitting control transistor T2. The second metal layer 33 may include a plate of a storage capacitor in the pixel drive circuit 30, a reference voltage line, or the like. The third metal layer 34 may include the first electrode and the second electrode, namely a source and a drain, of the light-emitting control transistor T2. The light-emitting element 20 includes the first electrode 21, the light-emitting layer 22, and the second electrode 23. The second electrode of the light-emitting control transistor T2 is electrically connected to the first electrode 21. In addition, an insulation layer is disposed between adjacent metal layers.

The light-emitting element 20 may be a light-emitting diode (LED), including but not limited to an organic LED (OLED), a mini LED, or a micro LED.

It should be noted that the light-emitting element 20 may further include an auxiliary light-emitting layer configured to promote recombination of a hole provided by the first electrode 21 (namely an anode) and an electron provided by the second electrode 23 (namely a cathode) in the light-emitting layer 22. For example, the auxiliary light-emitting layer may include one or more of a hole injection layer, a hole transport layer, an electron blocking layer, a hole blocking layer, an electron transport layer, and an electron injection layer, which is not limited herein. In some embodiments of the present disclosure, the light-emitting element 20 may include one or more of a red light-emitting element, a green light-emitting element, a blue light-emitting element, a white light-emitting element, a yellow light-emitting element, a cyan light-emitting element, and a magenta light-emitting element, which is not limited herein.

Referring to FIG. 5, a structure of the pixel drive circuit 30 may be set based on an actual situation and is not limited herein. A gate of the drive transistor T1 is electrically connected to a first node N1. The first electrode of the drive transistor T1 and the first electrode of the transmission transistor T3 are electrically connected to a second node N2. The second electrode of the drive transistor T1 and the first electrode of the light-emitting control transistor T2 are electrically connected to a third node N3. The second electrode of the light-emitting control transistor T2 and the first electrode 21 of the light-emitting element 20 are electrically connected to a fourth node N4. The gate of the light-emitting control transistor T2 is electrically connected to the light-emitting control scanning signal line Emit so that a light-emitting control scanning signal on the light-emitting control scanning signal line Emit can control the light-emitting control transistor T2 to be turned on or off. The gate of the transmission transistor T3 is electrically connected to the adjustment control signal line SP so that an adjustment control signal on the adjustment control signal line SP can control the transmission transistor T3 to be turned on or off. When the transmission transistor T3 is turned on, a signal (for example, a data signal provided by a data signal line) received by a second electrode of the transmission transistor T3 can be written into the second node N2.

Referring to FIG. 4 and FIG. 6, the first metal layer 32 may include the gate of the drive transistor T1, the gate of the light-emitting control transistor T2, the gate of the transmission transistor T3, the light-emitting control scanning signal line Emit, and the adjustment control signal line SP. The channel of the drive transistor T1 is an overlapping region of the first semiconductor layer 31 and the gate of the drive transistor T1. The channel of the transmission transistor T3 is an overlapping region of the first semiconductor layer 31 and the gate of the transmission transistor T3. In the same pixel sub-region PX, in the second direction Y, the orthographic projection of the light-emitting control scanning signal line Emit on the substrate 10 is located at the side of the orthographic projection of the channel of the transmission transistor T3 on the substrate 10 away from the orthographic projection of the channel of the drive transistor T1 on the substrate 10 so that the light-emitting control scanning signal line Emit and/or a jumper connected to the light-emitting control scanning signal line Emit do not overlap the first semiconductor layer 31 between the second node N2 and the channel of the transmission transistor T3, and the first semiconductor layer 31 between the second node N2 and the channel of the drive transistor T1. Thus, the light-emitting control scanning signal on the light-emitting control scanning signal line Emit can be prevented from having coupling impact on a voltage of the second node N2. This resolves a problem in the related art that the display panel is not black in a black state when the pixel drive circuit 30 operates in a low-frequency mode to drive the light-emitting element 20 to perform black-state display, thereby improving display quality of the display panel 100.

In some embodiments of the present disclosure, referring to FIG. 6, in the same pixel sub-region PX, in the second direction Y, the orthographic projection of the channel of the transmission transistor T3 on the substrate 10 is located at a side of the orthographic projection of the light-emitting control scanning signal line Emit on the substrate 10 away from orthographic projection of the adjustment control signal line SP on the substrate 10.

In some embodiments of the present disclosure, the adjustment control signal line SP is electrically connected to the gate of the transmission transistor T3 to control the transmission transistor T3 to be turned on or off. In the second direction Y, the orthographic projection of the channel of the transmission transistor T3 on the substrate 10 is located at the side of the orthographic projection of the light-emitting control scanning signal line Emit on the substrate 10 away from the orthographic projection of the adjustment control signal line SP on the substrate 10. In other words, the light-emitting control scanning signal line Emit is located between the channel of the transmission transistor T3 and the adjustment control signal line SP. In this way, there is no coupling relationship between the second node N2 and the light-emitting control scanning signal line Emit, thereby avoiding impact on a potential of the second node N2.

Further, referring to FIG. 6, the light-emitting control transistor T2 is formed at an overlapping position of the first semiconductor layer 31 and the first metal layer 32 in which the light-emitting control scanning signal line Emit is located.

Further, in some embodiments of the present disclosure, referring to FIG. 6, the light-emitting control scanning signal line Emit is reused as the gate of the light-emitting control transistor T2.

In some embodiments of the present disclosure, the light-emitting control transistor T2 is formed at an overlapping position of the first semiconductor layer 31 and a layer where the gate of the light-emitting control transistor T2 is located. The light-emitting control scanning signal line Emit is electrically connected to the gate of the light-emitting control transistor T2. The light-emitting control scanning signal line Emit is reused as the gate of the light-emitting control transistor T2. In this way, a line layout of the pixel drive circuit 30 can be simplified, a region occupied by the pixel drive circuit 30 is reduced, thereby improving a pixel density of the display panel 100.

In some embodiments of the present disclosure, referring to FIG. 6, the display panel 100 further includes a first connection line 301. The first connection line 301 includes a first end electrically connected to the gate of the transmission transistor T3 and a second end electrically connected to the adjustment control signal line SP. The first connection line 301 and the light-emitting control scanning signal line Emit overlap in different layers. The expression "overlaps in different layers" means that they are disposed in different layers and overlap in a direction perpendicular to a plane of the substrate 10.

In some embodiments of the present disclosure, because the orthographic projection of the light-emitting control scanning signal line Emit on the substrate 10 is located between the orthographic projection of the channel of the transmission transistor T3 on the substrate 10 and the orthographic projection of the adjustment control signal line SP on the substrate 10 in the second direction Y, and the adjustment control signal line SP needs to be electrically connected to the gate of the transmission transistor T3, the gate of the transmission transistor T3 can be connected to the adjustment control signal line SP through the first connection line 301. In addition, the first connection line 301 needs to be disposed in a different layer from the light-emitting control scanning signal line Emit, to avoid a short circuit at an overlapping position of the first connection line 301 and the light-emitting control scanning signal line Emit, which affects normal operation of the pixel drive circuit 30. The gate of the transmission transistor T3 is electrically connected to the adjustment control signal line SP through the first connection line 301. In this embodiment, the gate of the transmission transistor T3 and the adjustment control signal line SP are not an integrated structure, and the adjustment control signal line SP is not reused as the gate of the transmission transistor T3.

It should be noted that the first connection line 301 may be located in the second metal layer 33 or the third metal layer 34, which is not limited herein.

In some embodiments of the present disclosure, referring to FIG. 6, the first connection line 301 is disposed in a different layer from the gate of the transmission transistor T3. The gate of the transmission transistor T3 is disposed in a same layer as the adjustment control signal line SP.

In some embodiments of the present disclosure, the light-emitting control scanning signal line Emit and the adjustment control signal line SP are disposed in a same layer, that is, both located in the first metal layer 32. The first metal layer 32 may include the gate of the transmission transistor T3 so that the gate is disposed in the same layer as the adjustment control signal line SP. Because the first connection line 301 needs to be disposed in a different layer from the light-emitting control scanning signal line Emit so that the first connection line 301 is disposed in a different layer from the gate of the transmission transistor T3, the first connection line 301 may be connected to the gate of the transmission transistor T3 by punching holes.

In some embodiments of the present disclosure, referring to FIG. 6, the display panel 100 further includes a transmission signal line V1. The transmission signal line V1 is electrically connected to the second electrode of the transmission transistor T3 through a first via hole H1.

A voltage signal provided by the transmission signal line V1 may be a data signal or a fixed voltage signal, and may be adaptively set based on different structures of the pixel drive circuit 30.

In some embodiments of the present disclosure, referring to FIG. 5, the transmission signal line V1 is configured to transmit a data signal. The transmission transistor T3 is a data writing transistor configured to write the data signal into the gate of the drive transistor T1. The drive transistor T1 generates a drive current under the action of the data signal written into the gate thereof and a positive voltage signal pvdd provided by a first power signal line PVDD, and provides the drive current to the light-emitting element 20, to drive the light-emitting element 20 to emit light. It should be noted that all transistors in the pixel drive circuit 30 may be low-temperature polysilicon transistors, featuring a high switching speed, high carrier mobility, low costs, low power consumption, and small electric leakage. Other structures in the pixel drive circuit 30 may be set based on an actual situation, such as a 7T1C circuit (referring to FIG. 1), but not limited thereto.

Referring to FIG. 6, a layer where the transmission signal line V1 is located is disposed in different layer from the first semiconductor layer 31. The transmission signal line V1 is electrically connected to the second electrode of the transmission transistor T3 through the first via hole H1 so that the voltage signal on the transmission signal line V1 can be provided to the second electrode of the transmission transistor T3.

Further, in some embodiments of the present disclosure, referring to FIG. 6, because the transmission signal line V1 is disposed in a different layer from the light-emitting control scanning signal line Emit, and the first connection line 301 is further disposed in a different layer from the light-emitting control scanning signal line Emit. The first connection line 301 and the transmission signal line V1 may be disposed in a same layer, that is, both located in the third metal layer 34. In this way, a number of layers can be reduced, achieving a thin and light design of the display panel 100. The first connection line 301 and the transmission signal line V1 may be disposed in a same layer so that the first connection line 301 and the transmission signal line V1 can be simultaneously formed by using a same metal layer in a same process, reducing processes.

In some embodiments of the present disclosure, referring to FIG. 6, in the same pixel sub-region PX, in the second direction Y, the orthographic projection of the light-emitting control scanning signal line Emit on the substrate 10 is located at a side of orthographic projection of the first via hole H1 on the substrate 10 away from the orthographic projection of the channel of the drive transistor T1 on the substrate 10.

In some embodiments of the present disclosure, in the second direction Y, the orthographic projection of the first via hole H1 on the substrate 10 is located between the orthographic projection of the light-emitting control scanning signal line Emit on the substrate 10 and the orthographic projection of the channel of the drive transistor T1 on the substrate 10, instead of providing the first via hole H1 at a side of the orthographic projection of the light-emitting control scanning signal line Emit on the substrate 10 away from the orthographic projection of the channel of the drive transistor T1 on the substrate 10. In this way, a distance between the channel of the transmission transistor T3 and the first via hole H1 can be reduced, facilitating wiring of the pixel drive circuit 30 while reducing space occupied by the pixel drive circuit.

In some embodiments of the present disclosure, referring to FIG. 6, the first end of the first connection line 301 is electrically connected to the gate of the transmission transistor T3 through a second via hole H2. In the same pixel sub-region PX, in the first direction X, orthographic projection of the second via hole H2 on the substrate 10 is located at a side of the orthographic projection of the channel of the transmission transistor T3 on the substrate 10 away from orthographic projection of the transmission signal line V1 on the substrate 10.

In some embodiments of the present disclosure, because the first connection line 301 and the gate of the transmission transistor T3 are disposed in different layers, they need to be connected by punching holes, that is, the first end of the first connection line 301 is electrically connected to the gate of the transmission transistor T3 through the second via hole H2. If the orthographic projection of the second via hole H2 on the substrate 10 is located between the orthographic projection of the channel of the transmission transistor T3 on the substrate 10 and the orthographic projection of the transmission signal line V1 on the substrate 10, in order to achieve connection reliability of the pixel drive circuit 30, a position of the second node N2 needs to be moved in a direction extending in the first direction X to leave enough space for the second via hole H2. If the position of the second node N2 is changed, a gap position of the gate of the drive transistor T1 needs to be changed on the basis of the original pixel drive circuit 30, and an original process line needs to be changed, resulting in a large increase in costs.

There is narrow space between the transmission signal line V1 and the transmission transistor T3, so that the space for providing a via hole between the transmission signal line V1 and the transmission transistor T3 is limited. Because there is narrow space between the transmission signal line V1 and the transmission transistor T3, if the second via hole H2 has its orthographic projection on the substrate 10 located between the orthographic projection of the channel of the transmission transistor T3 on the substrate 10 and the orthographic projection of the transmission signal line V1 on the substrate 10 and is provided from the third metal layer 34 to the first metal layer 32, it is highly likely to cause a short circuit between the transmission signal line V1 and a part of the second via hole H2 in the third metal layer 34, resulting in an unwanted electrical connection. In addition, the adjustment control signal on the adjustment control signal line SP is used to control the transmission transistor T3 to be turned on or off. The adjustment control signal line SP is electrically connected to the second via hole H2. If the orthographic projection of the second via hole H2 on the substrate 10 is located between the orthographic projection of the channel of the transmission transistor T3 on the substrate 10 and the orthographic projection of the transmission signal line V1 on the substrate 10, there is an excessively short distance between the second via hole H2 and the transmission signal line V1. When jumping, the adjustment control signal transmitted through the second via hole H2 is coupled to the transmission signal line V1, resulting in impact on signal transmission on the transmission signal line V1.

Figure 7:
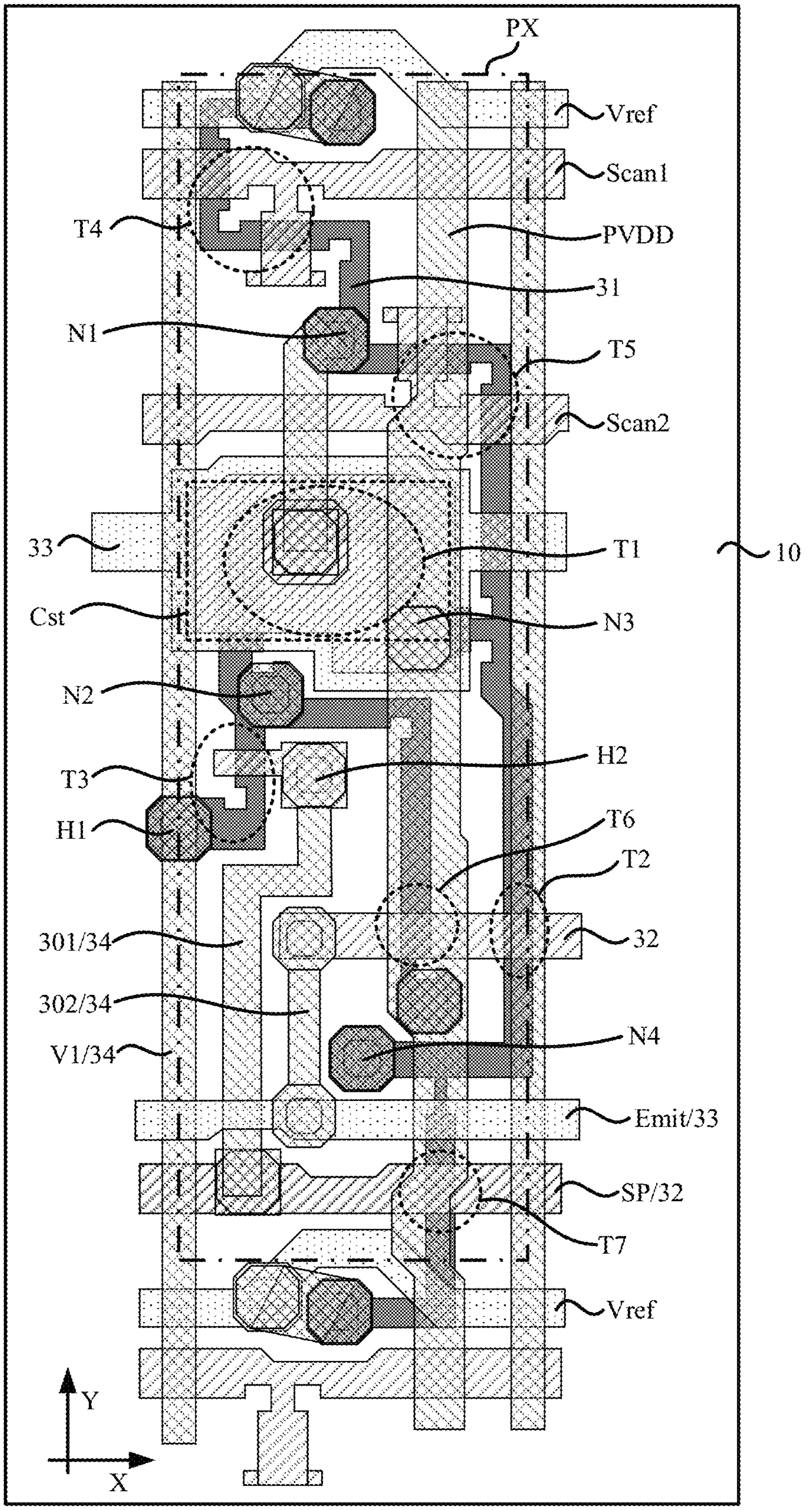
FIG. 7 is a structural schematic diagram of layers of a pixel drive circuit according to some embodiments of the present disclosure.

In some embodiments of the present disclosure, FIG. 7 is a structural schematic diagram of layers of a pixel drive circuit according to some embodiments of the present disclosure. Referring to FIG. 4, FIG. 5, and FIG. 7, in the same pixel sub-region PX, in the second direction Y, the orthographic projection of the light-emitting control scanning signal line Emit on the substrate 10 is located at a side of orthographic projection of a channel of the light-emitting control transistor T2 on the substrate 10 away from the orthographic projection of the channel of the drive transistor T1 on the substrate 10.

In some embodiments of the present disclosure, a region of the channel of the light-emitting control transistor T2 is an overlapping region of the first semiconductor layer 31 and the layer (namely the first metal layer 32) of the gate of the light-emitting control transistor T2. In the second direction Y, the orthographic projection of the light-emitting control scanning signal line Emit on the substrate 10 is located at the side of the orthographic projection of the channel of the light-emitting control transistor T2 on the substrate 10 away from the orthographic projection of the channel of the drive transistor T1 on the substrate 10 so that the light-emitting control scanning signal line Emit and the gate of the light-emitting control transistor T2 need to be connected through a connection line, namely the second connection line 302 in FIG. 7. In this way, the light-emitting control scanning signal on the light-emitting control scanning signal line Emit can control the light-emitting control transistor T2 to be turned on or off. In addition, the light-emitting control scanning signal line Emit and the second connection line 302 do not overlap the first semiconductor layer 31 between the second node N2 and the channel of the transmission transistor T3, and the first semiconductor layer 31 between the second node N2 and the channel of the drive transistor T1. Thus, the light-emitting control scanning signal on the light-emitting control scanning signal line Emit can be prevented from having coupling impact on the voltage of the second node N2. This resolves a problem in the related art that the display panel is not black in a black state when the pixel drive circuit 30 operates in a low-frequency mode to drive the light-emitting element 20 to perform black-state display, thereby improving display quality of the display panel 100.

Referring to FIG. 7, in some embodiments of the present disclosure, the orthographic projection of the adjustment control signal line SP on the substrate 10 may be located at the side of the orthographic projection of the light-emitting control scanning signal line Emit on the substrate 10 away from the orthographic projection of the channel of the drive transistor T1 on the substrate 10. In this way, a length of the second connection line 302 can be shortened, simplifying the line layout of the pixel drive circuit 30.

Figure 8:
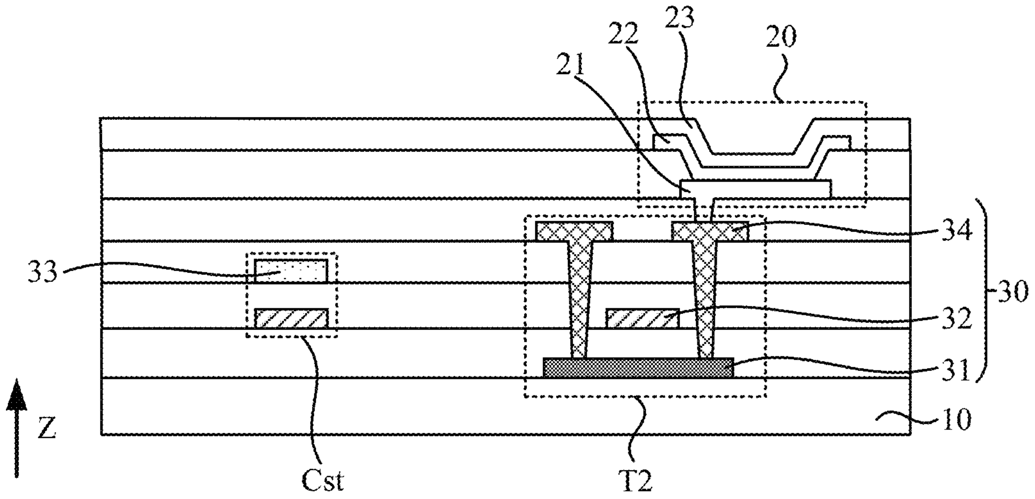
FIG. 8 is a sectional view of a display panel according to some embodiments of the present disclosure.

In some embodiments of the present disclosure, FIG. 8 is a sectional view of a display panel according to some embodiments of the present disclosure. Referring to FIG. 7 and FIG. 8, in the direction (namely a Z direction) perpendicular to the plane of the substrate 10, a layer of the light-emitting control scanning signal line Emit is located at a side of a layer of the gate of the drive transistor T1 away from the substrate 10.

In some embodiments of the present disclosure, it is highly likely to form an additional transistor at the overlapping position of the first metal layer 32 and the first semiconductor layer 31. Therefore, the light-emitting control scanning signal line Emit needs to be disposed at a side of the first metal layer 32 away from the first semiconductor layer 31. The first metal layer 32 may include the gate of the drive transistor T1. The light-emitting control scanning signal line Emit may be disposed at a side of the gate of the drive transistor T1 away from the substrate 10, in order to avoid affecting normal operation of the pixel drive circuit 30 due to additional transistors formed by the light-emitting control scanning signal line Emit and the first semiconductor layer 31.

In some embodiments of the present disclosure, referring to FIG. 7, the light-emitting control scanning signal line Emit may be located in the second metal layer 33, but is not limited thereto.

Figure 9:
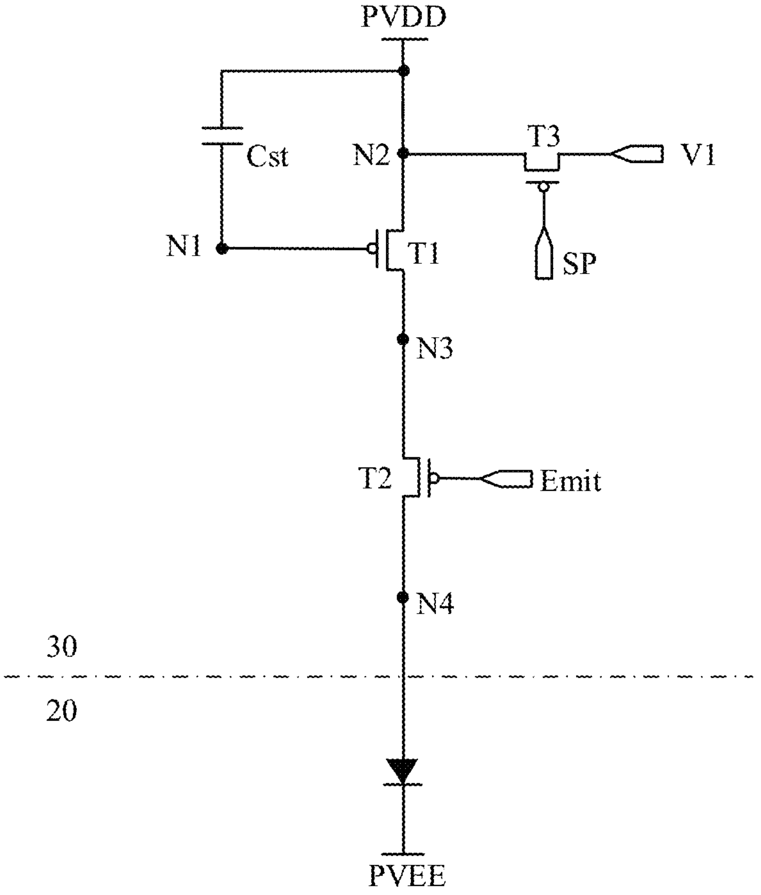
FIG. 9 is a structural schematic diagram of some elements of a pixel drive circuit according to some embodiments of the present disclosure.

In some embodiments of the present disclosure, FIG. 9 is a structural schematic diagram of some elements of a pixel drive circuit according to some embodiments of the present disclosure. Referring to FIG. 7, FIG. 8, and FIG. 9, the pixel drive circuit 30 further includes a storage capacitor Cst. The storage capacitor Cst includes a first plate and a second plate. The first plate is reused as the gate of the drive transistor T1. In the direction (namely the Z direction) perpendicular to the plane of the substrate 10, the first plate is located between the substrate 10 and the second plate. The light-emitting control scanning signal line Emit is disposed in a same layer as the second plate. In this way, the light-emitting control scanning signal line Emit and the second plate of the storage capacitor Cst can be simultaneously formed by using a same metal layer in a same process, reducing processes.

In some embodiments of the present disclosure, referring to FIG. 9, the pixel drive circuit 30 further includes the storage capacitor Cst. The first plate of the storage capacitor Cst may be electrically connected to the gate of the drive transistor T1. The second plate of the storage capacitor Cst may be electrically connected to the first power signal line PVDD. The storage capacitor Cst is configured to store the data signal written into the gate of the drive transistor T1.

Referring to FIG. 7 and FIG. 8, the first plate of the storage capacitor Cst is reused as the gate of the drive transistor T1. That is, the first plate of the storage capacitor Cst is located in the first metal layer 32. In this way, the first plate of the storage capacitor Cst does not need to be additionally disposed, to help reduce the space occupied by the pixel drive circuit 30. The first plate is located between the substrate 10 and the second plate. The second plate of the storage capacitor Cst may be located in the second metal layer 33. Considering that the light-emitting control scanning signal line Emit is located at the side of the gate of the drive transistor T1 away from the substrate 10 in the Z direction, the light-emitting control scanning signal line Emit may be disposed in the same layer as the second plate of the storage capacitor Cst, that is, the light-emitting control scanning signal line Emit is located in the second metal layer 33.

Figure 10:
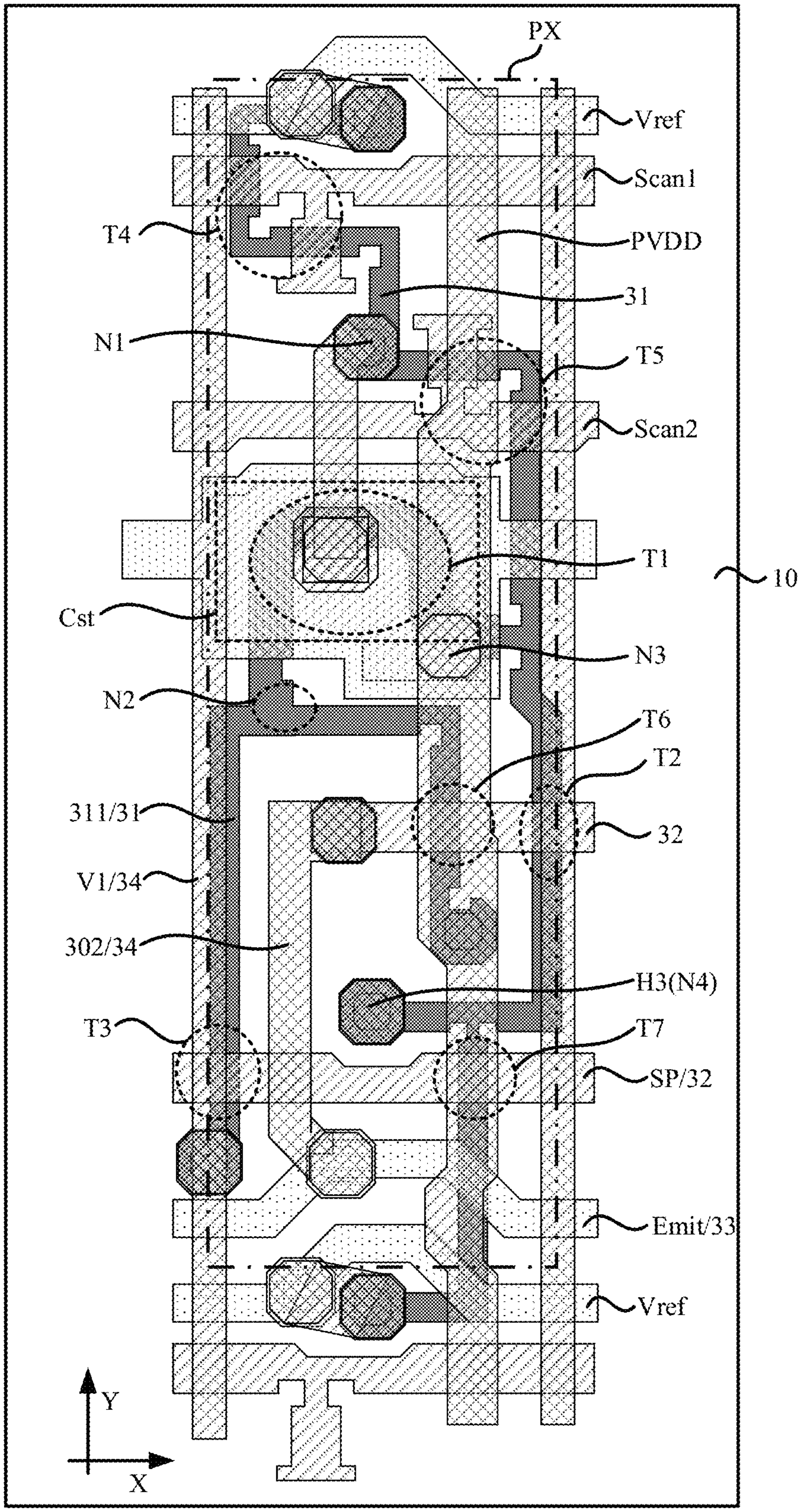
FIG. 10 is a structural schematic diagram of layers of a pixel drive circuit according to some embodiments of the present disclosure.

In some embodiments of the present disclosure, FIG. 10 is a structural schematic diagram of layers of a pixel drive circuit according to some embodiments of the present disclosure. As shown in FIG. 10, in the same pixel sub-region PX, in the second direction Y, the orthographic projection of the light-emitting control scanning signal line Emit on the substrate 10 is located at a side of the orthographic projection of the adjustment control signal line SP on the substrate 10 away from the orthographic projection of the channel of the drive transistor T1 on the substrate 10.

In some embodiments of the present disclosure, on the basis of the related art (shown in FIG. 2), orthographic projection of the gate of the light-emitting control transistor T2 on the substrate 10 is set to no overlap with orthographic projection of a connection line between the second node N2 and the first electrode of the transmission transistor T3 on the substrate 10. In FIG. 10, the connection line between the second node N2 and the first electrode of the transmission transistor T3 is a semiconductor wiring in the first semiconductor layer 31. In addition, in the second direction Y, the orthographic projection of the light-emitting control scanning signal line Emit on the substrate 10 is located at the side of the orthographic projection of the adjustment control signal line SP on the substrate 10 away from the orthographic projection of the channel of the drive transistor T1 on the substrate 10. That is, the orthographic projection of the light-emitting control scanning signal line Emit on the substrate 10 is located at the side of the orthographic projection of the channel of the transmission transistor T3 on the substrate 10 away from the orthographic projection of the channel of the drive transistor T1 on the substrate 10. The light-emitting control scanning signal line Emit is connected to the gate of the light-emitting control transistor T2 through a connection line to control the light-emitting control transistor T2 to be turned on or off. In this way, the light-emitting control scanning signal line Emit does not overlap the first semiconductor layer 31 between the second node N2 and the channel of the transmission transistor T3, and the first semiconductor layer 31 between the second node N2 and the channel of the drive transistor T1. Thus, the light-emitting control scanning signal on the light-emitting control scanning signal line Emit can be prevented from having coupling impact on the voltage of the second node N2. This resolves a problem in the related art that the display panel is not black in a black state when the pixel drive circuit 30 operates in a low-frequency mode to drive the light-emitting element 20 to perform black-state display, thereby improving display quality of the display panel 100.

In some embodiments of the present disclosure, referring to FIG. 4 and FIG. 10, the display panel 100 further includes a second connection line 302. The second connection line 302 includes a first end electrically connected to the gate of the light-emitting control transistor T2 and a second end electrically connected to the light-emitting control scanning signal line Emit. The second connection line 302 and the adjustment control signal line SP overlap in different layers.

In some embodiments of the present disclosure, because the orthographic projection of the adjustment control signal line SP on the substrate 10 is located between the orthographic projection of the channel of the light-emitting control transistor T2 on the substrate 10 and the orthographic projection of the light-emitting control scanning signal line Emit on the substrate 10 in the second direction Y, the gate of the light-emitting control transistor T2 and the adjustment control signal line SP need to be connected through the second connection line 302. In addition, the second connection line 302 and the adjustment control signal line SP overlap in different layers, in order to avoid affecting normal operation of the pixel drive circuit 30 due to a short circuit formed at an overlapping position of the second connection line 302 and the adjustment control signal line SP.

Referring to FIG. 4 and FIG. 10, the adjustment control signal line SP and the gate of the light-emitting control transistor T2 may be located in the same layer, that is, both located in the first metal layer 32. In this way, the second connection line 302 and the adjustment control signal line SP are disposed in different layers. The second connection line 302 may be located in the second metal layer 33 or the third metal layer 34, which is not limited herein. FIG. 10 exemplarily shows that the second connection line 302 is located in the third metal layer 34.

In some embodiments of the present disclosure, referring to FIG. 4, FIG. 5, and FIG. 10, the second electrode of the light-emitting control transistor T2 is connected to a third via hole H3. In the same pixel sub-region PX, an orthographic projection of the third via hole H3 on the substrate 10 and the orthographic projection of the channel of the transmission transistor T3 on the substrate 10 are respectively located at two sides of orthographic projection of the second connection line 302 on the substrate 10.

In some embodiments of the present disclosure, the second electrode of the light-emitting control transistor T2 and the first electrode 21 of the light-emitting element 20 are electrically connected to the fourth node N4. As can be seen from FIG. 4, because the second electrode of the light-emitting control transistor T2 and the first electrode 21 of the light-emitting element 20 are located in different metal layers, the second electrode of the light-emitting control transistor T2 and the first electrode 21 of the light-emitting element 20 need to be connected through the third via hole H3. Further, the orthographic projection of the third via hole H3 on the substrate 10 and the orthographic projection of the channel of the transmission transistor T3 on the substrate 10 are respectively located at two sides of the orthographic projection of the second connection line 302 on the substrate 10. In addition, the orthographic projection of the third via hole H3 on the substrate 10 and the orthographic projection of the channel of the light-emitting control transistor T2 on the substrate 10 are located at a same side of the orthographic projection of the second connection line 302 on the substrate 10. In this way, the orthographic projection of the second connection line 302 on the substrate 10 does not overlap the first semiconductor layer 31 between the fourth node N4 and the channel of the light-emitting control transistor T2. Thus, the light-emitting control scanning signal on the light-emitting control scanning signal line Emit can be prevented from having coupling impact on a voltage of the fourth node N4. This resolves a problem in the related art that the display panel is not black in a black state when the pixel drive circuit 30 operates in a low-frequency mode to drive the light-emitting element 20 to perform black-state display, thereby improving display quality of the display panel 100.

In some embodiments of the present disclosure, referring to FIG. 10, the display panel 100 further includes a patterned first semiconductor layer 31. The gate of the transmission transistor T3 is a portion of the adjustment control signal line SP overlapping the first semiconductor layer 31.

In some embodiments of the present disclosure, the channel of the transmission transistor T3 is an overlapping region of the gate of the transmission transistor T3 and the first semiconductor layer 31. The adjustment control signal line SP may be reused as the gate of the transmission transistor T3 so that an overlapping region of the adjustment control signal line SP and the first semiconductor layer 31 is the channel of the transmission transistor T3. In comparison with the layer structure of the conventional pixel drive circuit 30' shown in FIG. 2, a position of the transmission transistor T3 does not need to be adjusted. A metal wiring does not need to be additionally disposed as the gate of the transmission transistor T3. This can simplify the line layout of the pixel drive circuit 30 and reduce the region occupied by the pixel drive circuit 30. In addition, semiconductor wirings (including the first semiconductor wiring 311) in the first semiconductor layer 31 do not need to be disconnected at the second node N2. There is no need to connect two sections of a disconnected semiconductor wiring through another metal layer. The semiconductor wirings in the first semiconductor layer 31 are integrated, which is beneficial to signal transmission.

In some embodiments of the present disclosure, referring to FIG. 10, the display panel 100 further includes a transmission signal line V1. The transmission signal line V1 extends in the second direction Y, is electrically connected to a second electrode of the transmission transistor T3, and is configured to transmit a data signal. The first semiconductor layer 31 includes a first semiconductor wiring 311. The first semiconductor wiring 311 includes a first end electrically connected to the first electrode of the drive transistor T1 and a second end electrically connected to the first electrode of the transmission transistor T3. The first semiconductor wiring 311 extends in the second direction Y. The first semiconductor wiring 311 and the transmission signal line V1 overlap in different layers.

In some embodiments of the present disclosure, the first semiconductor wiring 311 is a connection line between the first electrode of the drive transistor T1 and the first electrode of the transmission transistor T3. The second node N2 is located on the first semiconductor wiring 311. Referring to FIG. 10, the transmission signal line V1 extends in the second direction Y and is connected to the second electrode of the transmission transistor T3. The first semiconductor wiring 311 further extends in the second direction Y. The first semiconductor wiring 311 and the transmission signal line V1 overlap in different layers. In this way, space occupied by the pixel drive circuit 30 in the first direction X can be reduced, improving the pixel density of the display panel 100.

It should be noted that the transmission signal line V1 further needs to be disposed in a different layer from the adjustment control signal line SP and the light-emitting control scanning signal line Emit. FIG. 10 exemplarily shows that the transmission signal line V1 may be located in the third metal layer 34.

In some embodiments of the present disclosure, referring to FIG. 10, the second connection line 302 is disposed at a same layer as the transmission signal line V1.

In some embodiments of the present disclosure, the second connection line 302 is disposed in a different layer from the adjustment control signal line SP, and the transmission signal line V1 further needs to be disposed in a different layer from the adjustment control signal line SP. In this way, the second connection line 302 may be disposed in a same layer as the transmission signal line V1. That is, the second connection line 302 and the transmission signal line V1 are both located in the third metal layer 34. This reduces a number of layers of the display panel 100 and helps achieve a thin and light design of the display panel 100. In this way, the second connection line 302 and the transmission signal line V1 can be simultaneously formed by using a same metal layer in a same process, reducing processes.

Figure 11:
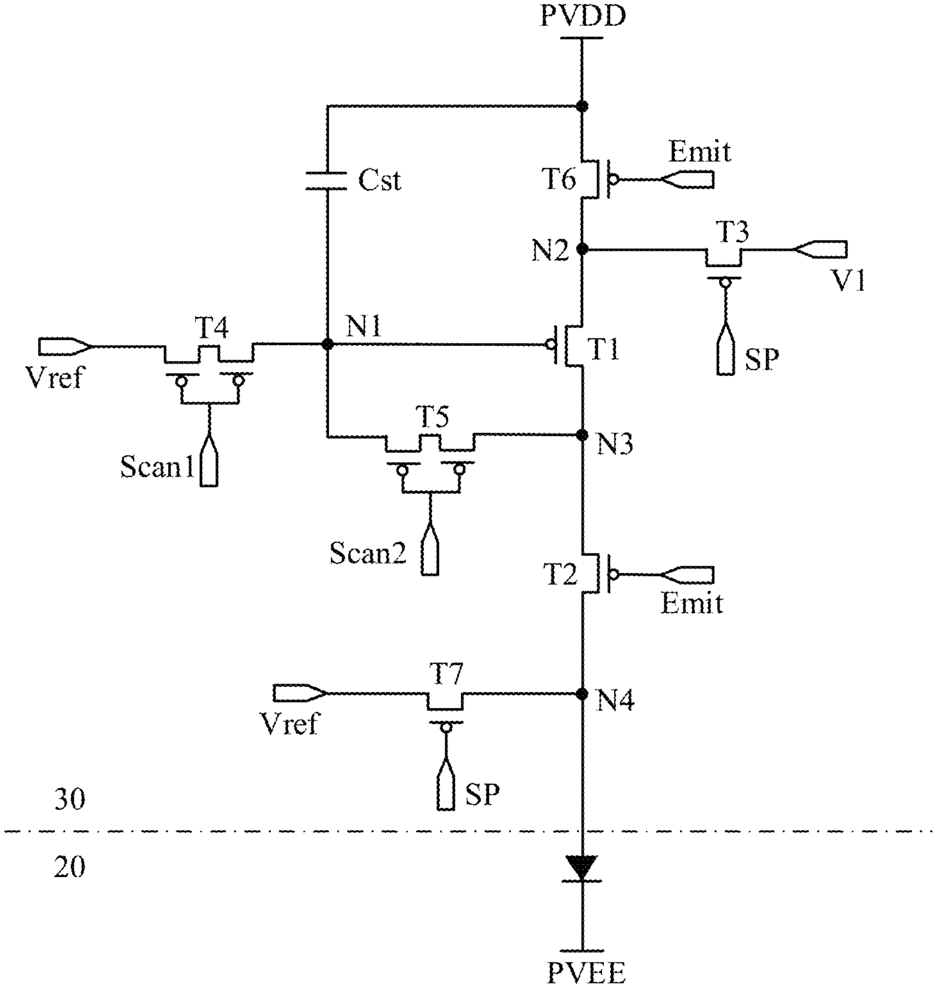
FIG. 11 is a structural schematic diagram of elements of a pixel drive circuit according to some embodiments of the present disclosure.

On the basis of any of the foregoing embodiments, FIG. 11 is a structural schematic diagram of elements of a pixel drive circuit according to some embodiments of the present disclosure. Referring to FIG. 6, FIG. 7, FIG. 10, and FIG. 11, the pixel drive circuit 30 may include the drive transistor T1, a first light-emitting control transistor (namely the light-emitting control transistor T2), the transmission transistor T3, a first reset transistor T4, a threshold compensation transistor T5, a second light-emitting control transistor T6, a light-emitting reset transistor T7, and the storage capacitor Cst. All transistors in the pixel drive circuit 30 may be low-temperature polysilicon transistors. Further, in some embodiments of the present disclosure, the transmission transistor T3 may be a data writing transistor. A signal transmitted by the transmission signal line V1 is a data signal. It can be understood that the seven transistors in the pixel drive circuit 30 are controlled by corresponding scanning signals (signals transmitted by a first scanning signal line Scan1, a second scanning signal line Scan2, the light-emitting control scanning signal line Emit, and the adjustment control signal line SP) to be turned on or off, to control on/off of paths of the data signal transmitted by the transmission signal line V1 and a reset signal transmitted by a reference voltage line Vref, and to control timing of providing a drive current to the light-emitting element 20, which is not described in detail herein.

Figure 12:
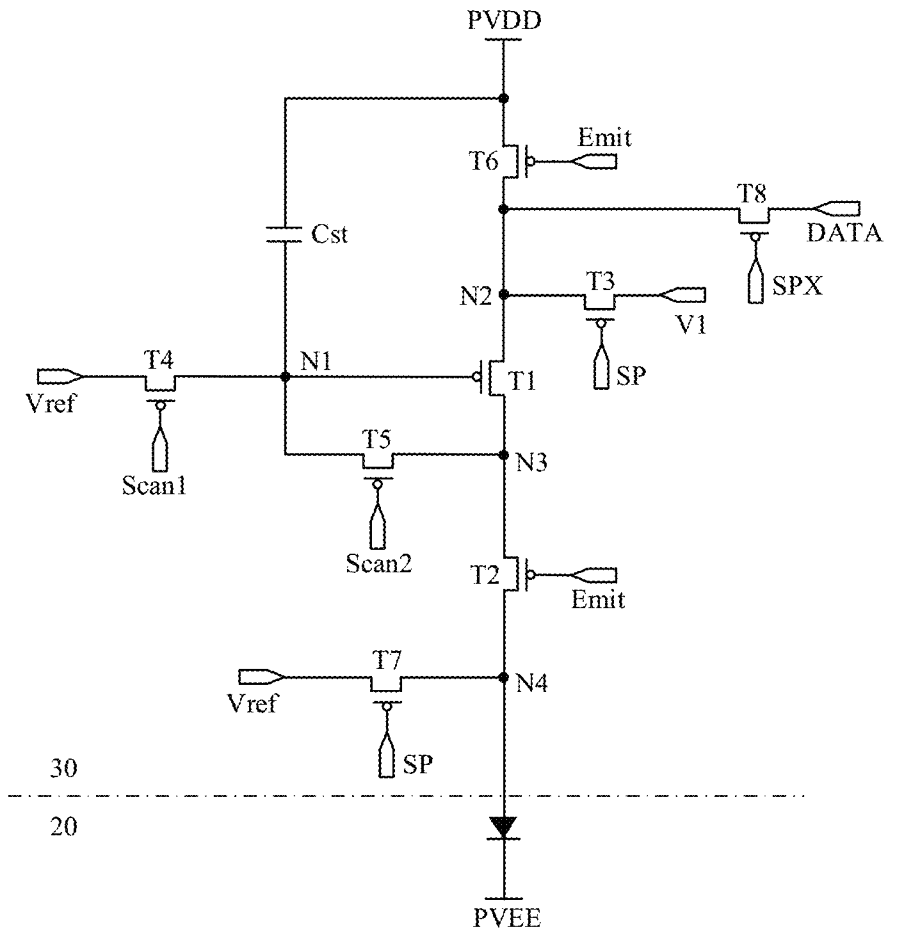
FIG. 12 is a structural schematic diagram of elements of a pixel drive circuit according to some embodiments of the present disclosure.
Figure 13:
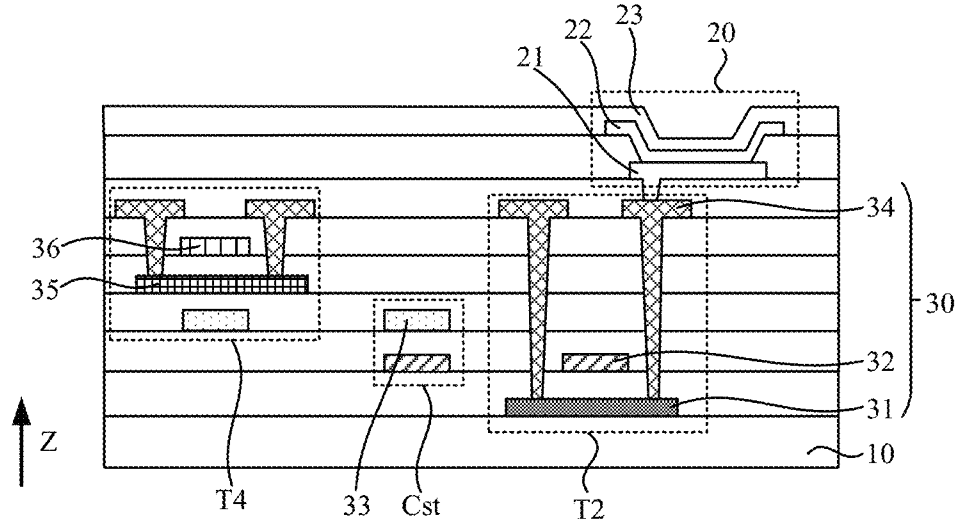
FIG. 13 is a sectional view of a display panel according to some embodiments of the present disclosure.
Figure 14:
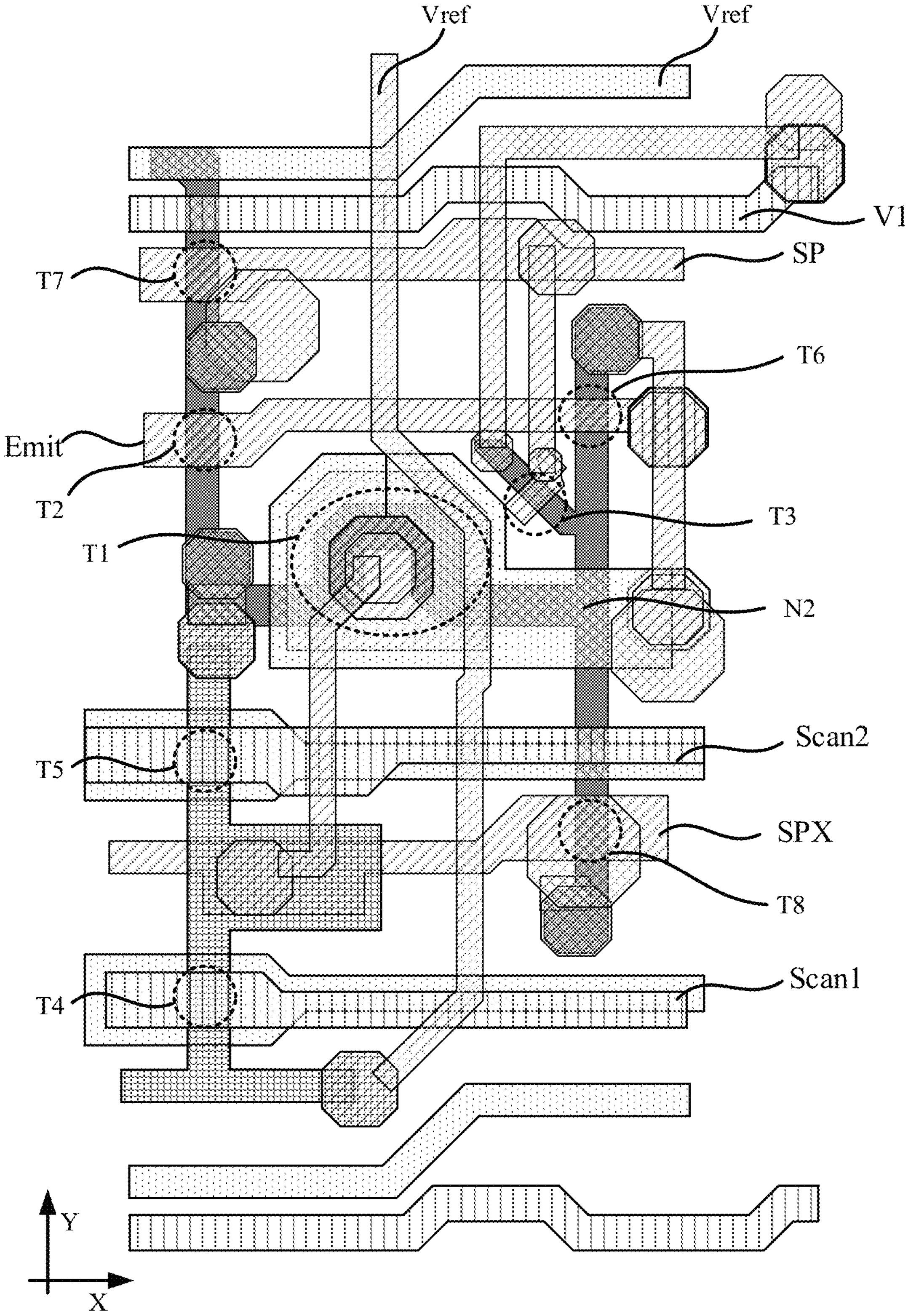
FIG. 14 is a structural schematic diagram of layers of a pixel drive circuit according to some embodiments of the present disclosure.

FIG. 12 is a structural schematic diagram of elements of a pixel drive circuit according to some embodiments of the present disclosure. FIG. 13 is a sectional view of a display panel according to some embodiments of the present disclosure. FIG. 14 is a structural schematic diagram of layers of a pixel drive circuit according to some embodiments of the present disclosure. Referring to FIG. 12, FIG. 13, and FIG. 14, the display panel 100 further includes a transmission signal line V1. The transmission signal line V1 is electrically connected to a second electrode of the transmission transistor T3. The transmission signal line V1 is configured to transmit a direct current (DC) voltage signal. The transmission transistor T3 is a bias adjustment transistor configured to write a bias adjustment voltage into the first electrode of the drive transistor T1.

In some embodiments of the present disclosure, when the bias adjustment transistor is turned on, the DC voltage signal transmitted by the transmission signal line V1 can be written into the second node N2 to apply an on-state bias voltage to the drive transistor T1. This resolves a characteristic offset or hysteresis issue of the drive transistor T1 after long-term operation, avoiding flicker when the display panel 100 maintains image display, and improving display effect.

In some embodiments of the present disclosure, the pixel drive circuit 30 further includes a storage capacitor Cst and a first reset transistor T4. The storage capacitor Cst includes a first plate and a second plate. The first plate is reused as the gate of the drive transistor T1. In the direction (namely the Z direction) perpendicular to the plane of the substrate 10, the first plate is located between the substrate 10 and the second plate. The first reset transistor T4 includes a first electrode electrically connected to the first plate, an oxide semiconductor channel, and a top gate. In the direction (namely the Z direction) perpendicular to the plane of the substrate 10, the oxide semiconductor channel is located between the second plate and the top gate. The transmission signal line V1 is disposed in a same layer as the top gate. In this way, the transmission signal line V1 and the top gate of the first reset transistor T4 can be simultaneously formed by using a same metal layer in a same process, reducing processes.

Referring to FIG. 12, unlike the element structure of the pixel drive circuit 30 shown in FIG. 11, the transmission transistor T3 in the pixel drive circuit 30 shown in FIG. 12 is a bias adjustment transistor. A first electrode of a data writing transistor T8 in the pixel drive circuit 30 is electrically connected to a data signal line DATA. A second electrode of the data writing transistor T8 is electrically connected to the first electrode of the drive transistor T1. A gate of the data writing transistor T8 is electrically connected to a data writing control signal line SPX.

Referring to FIG. 13 and FIG. 14, the display panel 100 may further include a second semiconductor layer 35 and a fourth metal layer 36. The second semiconductor layer 35 and the fourth metal layer 36 are both located between the second metal layer 33 and the third metal layer 34. The second semiconductor layer 35 is located at a side of the fourth metal layer 36 close to the second metal layer 33. The first reset transistor T4 may include an oxide semiconductor channel, a bottom gate, and a top gate. The bottom gate is located in the second metal layer 33. The first plate of the storage capacitor Cst in the pixel drive circuit 30 is reused as the gate of the drive transistor T1. The first plate may be located in the first metal layer 32. The second plate may be located in the second metal layer 33. The oxide semiconductor channel is located between the second plate and the top gate. The oxide semiconductor channel may be located in the second semiconductor layer 35. The top gate may be located in the fourth metal layer 36.

Referring to FIG. 14, the transmission signal line V1 is configured to transmit the DC voltage signal. The transmission signal line V1 may be disposed in a same layer as the top gate of the first reset transistor T4, that is, located in the fourth metal layer 36. In this way, a number of layers of the display panel 100 is reduced, achieving a thin and light design of the display panel 100.

For example, referring to FIG. 12 to FIG. 14, the adjustment control signal line SP extends in the first direction X and is connected to the gate of the transmission transistor T3. The light-emitting control scanning signal line Emit extends in the first direction X and is connected to the gate of the light-emitting control transistor T2. In the same pixel sub-region, in the second direction Y, the orthographic projection of the light-emitting control scanning signal line Emit on the substrate 10 is located at the side of the orthographic projection of the channel of the transmission transistor T3 on the substrate 10 away from the orthographic projection of the channel of the drive transistor T1 on the substrate 10. In this way, the light-emitting control scanning signal line Emit and/or the jumper connected to the light-emitting control scanning signal line Emit do not overlap the first semiconductor layer 31 between the second node N2 and the channel of the transmission transistor T3. Thus, the light-emitting control scanning signal on the light-emitting control scanning signal line Emit can be prevented from having coupling impact on the voltage of the second node N2.

Figure 15:
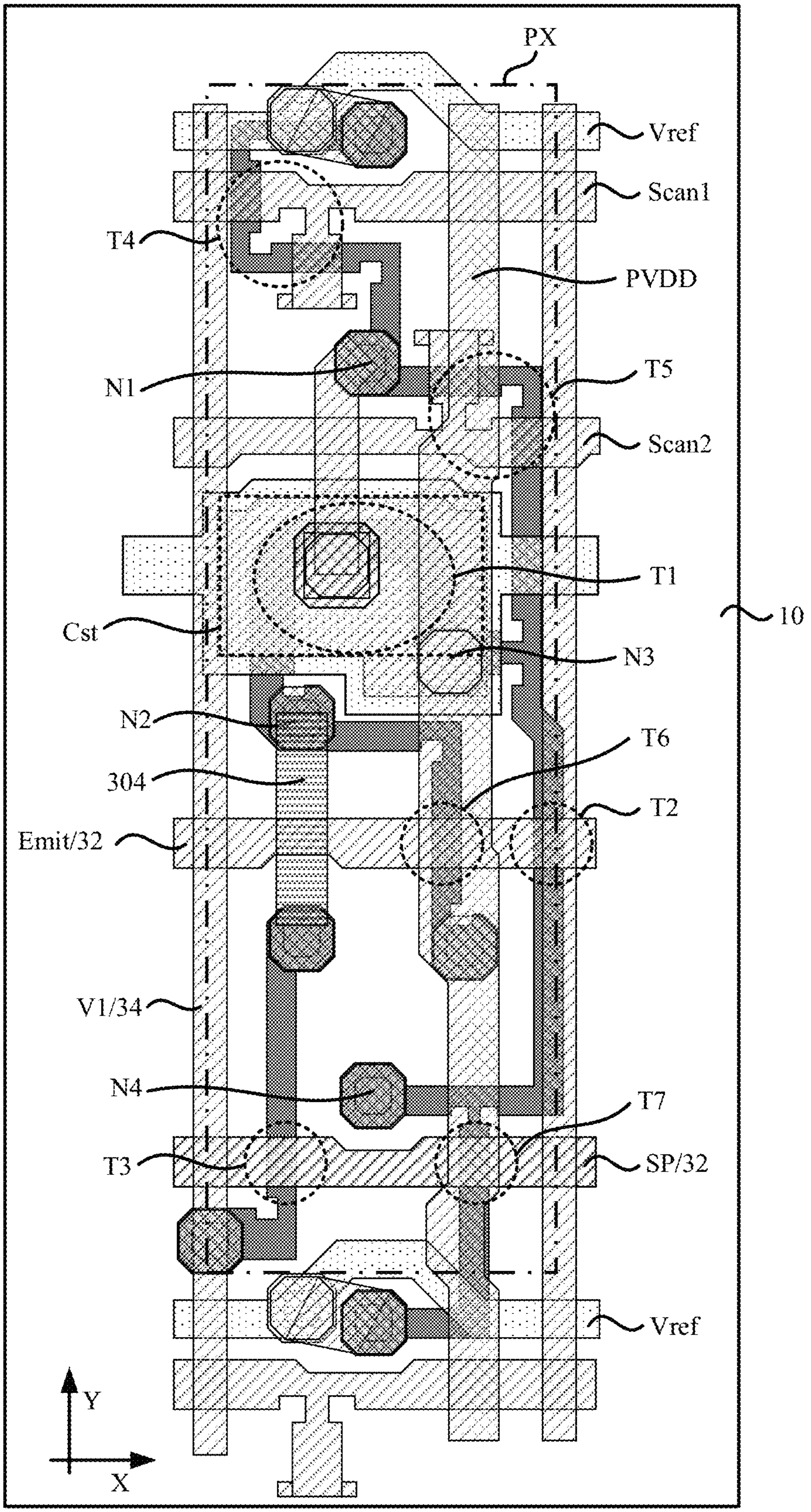
FIG. 15 is a structural schematic diagram of layers of a pixel drive circuit according to some embodiments of the present disclosure.

In other embodiments, FIG. 15 is a structural schematic diagram of layers of a pixel drive circuit according to some embodiments of the present disclosure. Referring to FIG. 4, FIG. 11, and FIG. 15, a crossover line (namely a fourth connection line 304 in FIG. 15) connecting the second node N2 and the first electrode of the transmission transistor T3 may be disposed in any metal layer at a side of the third metal layer 34 away from the substrate 10 to increase a distance between the fourth connection line 304 and the light-emitting control scanning signal line Emit in the direction (Z direction) perpendicular to the plane of the substrate 10. In this way, a parasitic capacitance between the fourth connection line 304 and the light-emitting control scanning signal line Emit is reduced, reducing coupling impact of the light-emitting control scanning signal on the light-emitting control scanning signal line Emit on the voltage of the second node N2, and resolving a problem in the related art that the display panel is not black in a black state when the pixel drive circuit 30 operates in a low-frequency mode to drive the light-emitting element 20 to perform black-state display, thereby improving display quality of the display panel 100.

Figure 16:
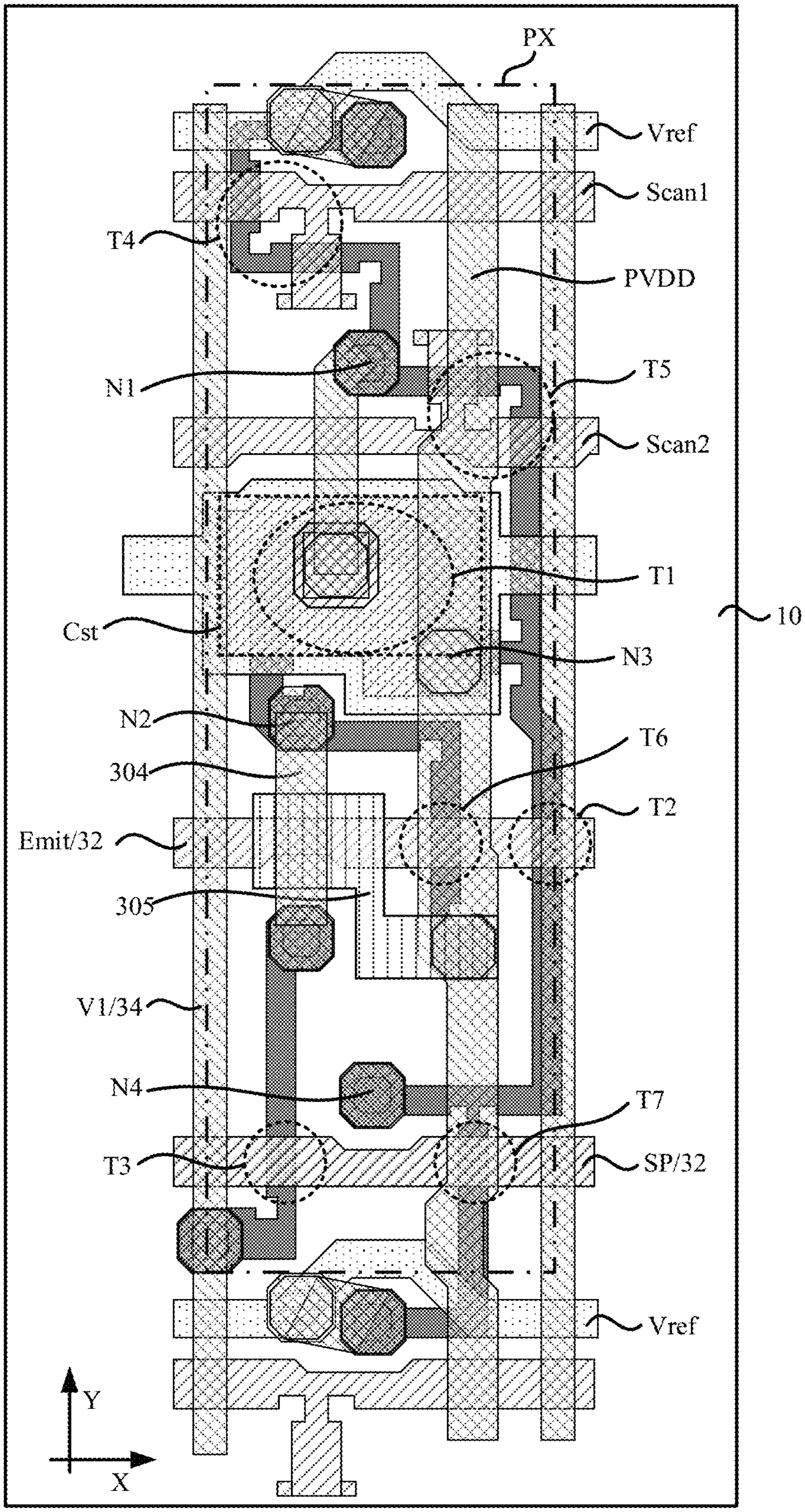
FIG. 16 is a structural schematic diagram of layers of a pixel drive circuit according to some embodiments of the present disclosure.

In another optional embodiment, FIG. 16 is a structural schematic diagram of layers of a pixel drive circuit according to some embodiments of the present disclosure. Referring to FIG. 4, FIG. 11, and FIG. 16, in the direction (Z direction) perpendicular to the plane of the substrate 10, a shielding metal block 305 may be disposed between the light-emitting control scanning signal line Emit and a crossover line (namely a fourth connection line 304 in FIG. 16) connecting the second node N2 and the first electrode of the transmission transistor T3. The fourth connection line 304 may be located in the third metal layer 34. The light-emitting control scanning signal line Emit may be located in the first metal layer 32. The shielding metal block 305 may be located in a layer of the second metal layer 33. Referring to FIG. 16, the shielding metal block 305 may be connected to the first power signal line PVDD so that the first power signal line PVDD can provide a fixed voltage signal to the shielding metal block 305, to blocking coupling impact of the light-emitting control scanning signal on the light-emitting control scanning signal line Emit on the voltage of the second node N2. This resolves a problem in the related art that the display panel is not black in a black state when the pixel drive circuit 30 operates in a low-frequency mode to drive the light-emitting element 20 to perform black-state display, thereby improving display quality of the display panel 100.

Figure 17:
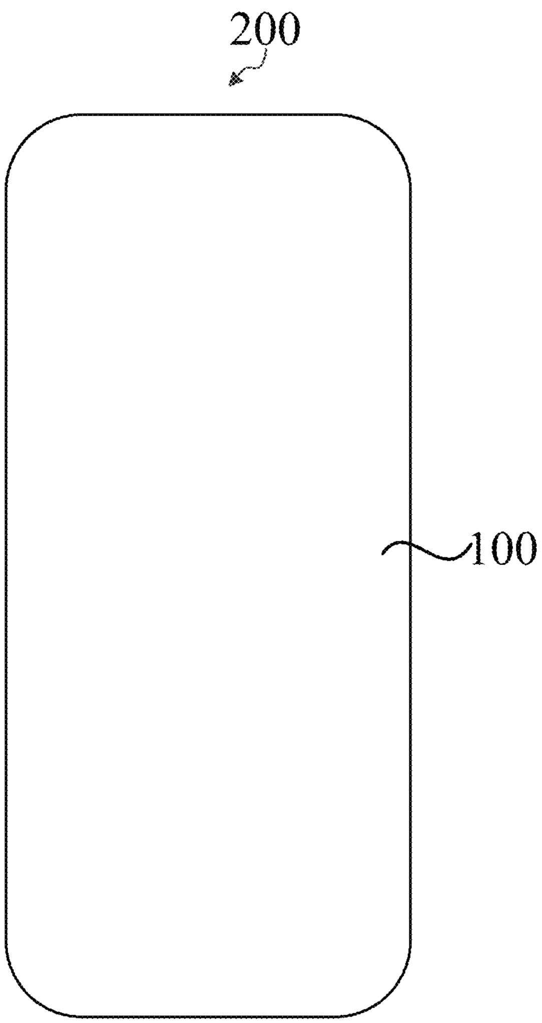
FIG. 17 is a structural schematic diagram of a display apparatus according to some embodiments of the present disclosure.

Based on a same inventive concept, the embodiments of the present disclosure further provide a display apparatus. FIG. 17 is a structural schematic diagram of a display apparatus according to some embodiments of the present disclosure. As shown in FIG. 17, the display apparatus 200 includes the display panel 100 according to any embodiment of the present disclosure. The display apparatus 200 provided in the embodiments of the present disclosure may be a mobile phone or any electronic product having a display function, including but not limited to a television, a laptop computer, a desktop display, a tablet computer, a digital camera, a smart bracelet, smart glasses, a vehicle-mounted display, a medical device, an industrial control device, and a touch interactive terminal, which is not particularly limited in the present disclosure.

The foregoing is merely the preferred embodiments of the present disclosure and the technical principle in use. Those skilled in the art understand that the present disclosure is not limited to the specific embodiments described herein, and various obvious changes, adjustments, combinations, and substitutions can be made by those skilled in the art, and do not depart from the protection scope of the present disclosure. Therefore, although the present disclosure has been described in detail by using the foregoing embodiments, the present disclosure is not limited to the foregoing embodiments, but can further include more other equivalent embodiments without departing from the concept of the present disclosure, and the scope of the present disclosure is determined by the scope of the appended claims.

What is claimed is:

1. A display panel, comprising:

pixel sub-regions;

a substrate;

a light-emitting element comprising a first electrode, a light-emitting layer and a second electrode;

a pixel drive circuit located at a side of the substrate and at least partially located in one of the pixel sub-regions, wherein the pixel drive circuit comprises a drive transistor, a light-emitting control transistor, and a transmission transistor, the drive transistor comprises a first electrode electrically connected to a first electrode of the transmission transistor and a second electrode electrically connected to a first electrode of the light-emitting control transistor, and a second electrode of the light-emitting control transistor is electrically connected to the first electrode of the light-emitting element;

an adjustment control signal line extending in a first direction and connected to a gate of the transmission transistor; and a light-emitting control scanning signal line extending in the first direction and connected to a gate of the light-emitting control transistor;

wherein in a same pixel sub-region of the pixel sub-regions, in a second direction, an orthographic projection of the light-emitting control scanning signal line on the substrate is located at a side of an orthographic projection of a channel of the transmission transistor on the substrate away from an orthographic projection of a channel of the drive transistor on the substrate; and the first direction intersects the second direction;

wherein in the same pixel sub-region, in the second direction, the orthographic projection of the channel of the transmission transistor on the substrate is located at a side of the orthographic projection of the light-emitting control scanning signal line on the substrate away from orthographic projection of the adjustment control signal line on the substrate; and wherein the display panel further comprises a first connection line, wherein the first connection line comprises a first end electrically connected to the gate of the transmission transistor and a second end electrically connected to the adjustment control signal line; and the first connection line and the light-emitting control scanning signal line overlap in different layers.

2. The display panel according to claim 1, wherein the first connection line is disposed in a different layer from the gate of the transmission transistor, and the gate of the transmission transistor is disposed in a same layer as the adjustment control signal line.

3. The display panel according to claim 1, further comprising a transmission signal line electrically connected to a second electrode of the transmission transistor through a first via hole.

4. The display panel according to claim 3, wherein in the same pixel sub-region, in the second direction, the orthographic projection of the light-emitting control scanning signal line on the substrate is located at a side of an orthographic projection of the first via hole on the substrate away from the orthographic projection of the channel of the drive transistor on the substrate.

5. The display panel according to claim 3, wherein the transmission signal line is configured to transmit a data signal; and the transmission transistor is a data writing transistor configured to write the data signal into a gate of the drive transistor.

6. The display panel according to claim 3, wherein the first end of the first connection line is electrically connected to the gate of the transmission transistor through a second via hole; and in the same pixel sub-region, in the first direction, orthographic projection of the second via hole on the substrate is located at a side of the orthographic projection of the channel of the transmission transistor on the substrate away from orthographic projection of the transmission signal line on the substrate.

7. The display panel according to claim 6, wherein the first connection line is disposed in a same layer as the transmission signal line.

8. The display panel according to claim 1, wherein the light-emitting control scanning signal line is reused as the gate of the light-emitting control transistor.

9. The display panel according to claim 1, wherein in the same pixel sub-region, in the second direction, the orthographic projection of the light-emitting control scanning signal line on the substrate is located at a side of an orthographic projection of a channel of the light-emitting control transistor on the substrate away from the orthographic projection of the channel of the drive transistor on the substrate.

10. The display panel according to claim 9, wherein in a direction perpendicular to a plane of the substrate, a layer of the light-emitting control scanning signal line is located at a side of a layer of a gate of the drive transistor away from the substrate.

11. The display panel according to claim 10, wherein the pixel drive circuit further comprises a storage capacitor, the storage capacitor comprises a first plate and a second plate, and the first plate is reused as the gate of the drive transistor; and in the direction perpendicular to the plane of the substrate, the first plate is located between the substrate and the second plate; and the light-emitting control scanning signal line is disposed in a same layer as the second plate.

12. The display panel according to claim 9, wherein in the same pixel sub-region, the orthographic projection of the light-emitting control scanning signal line on the substrate in the second direction is located at a side of an orthographic projection of the adjustment control signal line on the substrate away from the orthographic projection of the channel of the drive transistor on the substrate.

13. A display panel, comprising:

pixel sub-regions;

a substrate;

a light-emitting element comprising a first electrode, a light-emitting layer and a second electrode;

a pixel drive circuit located at a side of the substrate and at least partially located in one of the pixel sub-regions, wherein the pixel drive circuit comprises a drive transistor, a light-emitting control transistor, and a transmission transistor, the drive transistor comprises a first electrode electrically connected to a first electrode of the transmission transistor and a second electrode electrically connected to a first electrode of the light-emitting control transistor, and a second electrode of the light-emitting control transistor is electrically connected to the first electrode of the light-emitting element;

an adjustment control signal line extending in a first direction and connected to a gate of the transmission transistor; and a light-emitting control scanning signal line extending in the first direction and connected to a gate of the light-emitting control transistor;

wherein in a same pixel sub-region of the pixel sub-regions, in a second direction, an orthographic projection of the light-emitting control scanning signal line on the substrate is located at a side of an orthographic projection of a channel of the transmission transistor on the substrate away from an orthographic projection of a channel of the drive transistor on the substrate; and the first direction intersects the second direction;

wherein in the same pixel sub-region, in the second direction, the orthographic projection of the light-emitting control scanning signal line on the substrate is located at a side of an orthographic projection of a channel of the light-emitting control transistor on the substrate away from the orthographic projection of the channel of the drive transistor on the substrate;

wherein in the same pixel sub-region, the orthographic projection of the light-emitting control scanning signal line on the substrate in the second direction is located at a side of an orthographic projection of the adjustment control signal line on the substrate away from the orthographic projection of the channel of the drive transistor on the substrate; and wherein the display panel further comprises a second connection line, wherein the second connection line comprises a first end electrically connected to the gate of the light-emitting control transistor and a second end electrically connected to the light-emitting control scanning signal line; and the second connection line and the adjustment control signal line overlap in different layers.

14. The display panel according to claim 13, wherein the second electrode of the light-emitting control transistor is connected to a third via hole; and in the same pixel sub-region, an orthographic projection of the third via hole on the substrate and the orthographic projection of the channel of the transmission transistor on the substrate are respectively located at two sides of an orthographic projection of the second connection line on the substrate.

15. The display panel according to claim 13, further comprising a patterned first semiconductor layer, wherein the gate of the transmission transistor is a portion of the adjustment control signal line overlapping the first semiconductor layer.

16. The display panel according to claim 15, further comprising a transmission signal line extending in the second direction, wherein the transmission signal line is electrically connected to a second electrode of the transmission transistor, and configured to transmit a data signal;

wherein the first semiconductor layer comprises a first semiconductor wiring, and the first semiconductor wiring comprises a first end electrically connected to the first electrode of the drive transistor and a second end electrically connected to the first electrode of the transmission transistor; and the first semiconductor wiring extends in the second direction, and the first semiconductor and the transmission signal line overlap in different layers.

17. The display panel according to claim 16, wherein the second connection line is disposed in a same layer as the transmission signal line.

18. A display apparatus, comprising a display panel, wherein the display panel comprises:

pixel sub-regions;

a substrate;

a light-emitting element comprising a first electrode, a light-emitting layer and a second electrode;

a pixel drive circuit located at a side of the substrate and at least partially located in one of the pixel sub-regions, wherein the pixel drive circuit comprises a drive transistor, a light-emitting control transistor, and a transmission transistor, the drive transistor comprises a first electrode electrically connected to a first electrode of the transmission transistor and a second electrode electrically connected to a first electrode of the light-emitting control transistor, and a second electrode of the light-emitting control transistor is electrically connected to the first electrode of the light-emitting element;

an adjustment control signal line extending in a first direction and connected to a gate of the transmission transistor; and a light-emitting control scanning signal line extending in the first direction and connected to a gate of the light-emitting control transistor;

wherein in a same pixel sub-region of the pixel sub-regions, in a second direction, an orthographic projection of the light-emitting control scanning signal line on the substrate is located at a side of an orthographic projection of a channel of the transmission transistor on the substrate away from an orthographic projection of a channel of the drive transistor on the substrate; and the first direction intersects the second direction;

wherein in the same pixel sub-region, in the second direction, the orthographic projection of the channel of the transmission transistor on the substrate is located at a side of the orthographic projection of the light-emitting control scanning signal line on the substrate away from orthographic projection of the adjustment control signal line on the substrate; and wherein the display panel further comprises a first connection line, wherein the first connection line comprises a first end electrically connected to the gate of the transmission transistor and a second end electrically connected to the adjustment control signal line; and the first connection line and the light-emitting control scanning signal line overlap in different layers.

* * * * *